(12) United States Patent
Ju

(10) Patent No.: US 11,522,143 B2
(45) Date of Patent: Dec. 6, 2022

(54) DISPLAY DEVICE HAVING A CIRCUIT BOARD CONNECTED TO A SIGNAL LINE BY A CONDUCTIVE MATERIAL IN A SUBSTRATE

(71) Applicant: Samsung Display Co., LTD., Yongin-si (KR)

(72) Inventor: Sung Bae Ju, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 217 days.

(21) Appl. No.: 17/114,732

(22) Filed: Dec. 8, 2020

(65) Prior Publication Data

US 2021/0343951 A1 Nov. 4, 2021

(30) Foreign Application Priority Data

May 4, 2020 (KR) .................. 10-2020-0053356

(51) Int. Cl.
*H01L 27/32* (2006.01)
*H01L 51/00* (2006.01)
*H01L 23/00* (2006.01)

(52) U.S. Cl.
CPC .......... *H01L 51/0096* (2013.01); *H01L 24/32* (2013.01); *H01L 27/3276* (2013.01); *H01L 27/323* (2013.01); *H01L 27/3216* (2013.01); *H01L 2224/32227* (2013.01)

(58) Field of Classification Search
CPC ..... H01L 24/32; H01L 27/32; H01L 24/3276; H01L 51/0096; H01L 2251/5338
USPC .................................................. 257/59, 72
See application file for complete search history.

(56) References Cited

U.S. PATENT DOCUMENTS 10,021,763 B2  7/2018  Park et al.
2018/0349719 A1* 12/2018  Lius ............... G02F 1/133514

FOREIGN PATENT DOCUMENTS

| CN | 110649184 A | 1/2020 |
| KR | 10-1519519 B1 | 5/2015 |
| KR | 10-1722292 B1 | 3/2017 |
| KR | 10-1736930 B1 | 5/2017 |
| KR | 10-2055194 B1 | 12/2019 |

* cited by examiner

*Primary Examiner* — Hoai V Pham
(74) *Attorney, Agent, or Firm* — Cantor Colburn LLP

(57) ABSTRACT

A display device includes a substrate including a display area, a non-display area and a conductive material, a display layer on a top surface of the substrate and including a light-emitting element, a signal line extending from the display layer and into the non-display area, a conductive adhesive member on a bottom surface of the substrate, and a circuit board which is electrically connected to the signal line by contact of the circuit board with the conductive adhesive member, together with contact of the conductive material in the substrate with both the signal line and the conductive adhesive member.

20 Claims, 18 Drawing Sheets

DISPLAY DEVICE HAVING A CIRCUIT BOARD CONNECTED TO A SIGNAL LINE BY A CONDUCTIVE MATERIAL IN A SUBSTRATE

This application claims priority to Korean Patent Application No. 10-2020-0053356 filed on May 4, 2020, and all the benefits accruing therefrom under 35 U.S.C. § 119, the disclosure of which is incorporated herein by reference in its entirety.

BACKGROUND

1. Field

The disclosure relates to a display device.

2. Description of the Related Art

Display devices have increasingly become of importance with the development of multimedia. Various types of display devices, such as a liquid crystal display ("LCD") device, an organic light-emitting diode ("OLED") display device, or the like, have been used.

Foldable display devices have increasingly attracted attention. Foldable display is devices have the advantages of smartphones and tablet personal computers ("PCs") because they are portable and have wide display screens. In a foldable display device, a pad portion where drive integrated circuits ("ICs") or other printed circuit boards are disposed, may be provided at an edge part of the outer portion of a substrate that forms the foldable display device. The pad portion may correspond to the bezel of the foldable display device, which is a non-display area at which no image is displayed.

SUMMARY

Embodiments provide a display device which includes pad portion and minimizes the size of the bezel.

However, embodiments are not restricted to those set forth herein. The above and other embodiments will become more apparent to one of ordinary skill in the art to which the invention pertains by referencing the detailed description given below.

According to an embodiment, the display device includes a substrate including a display area, a non-display area and a conductive material, a display layer on a top surface of the substrate and including a light-emitting element, a signal line extending from the display layer and into the non-display area, a conductive adhesive member on a bottom surface of the substrate, and a circuit board which is electrically connected to the signal line by contact of the circuit board with the conductive adhesive member, together with contact of the conductive material in the substrate with both the signal line and the conductive adhesive member.

In an embodiment, the conductive material may include a plurality of first conductive balls, and the substrate may further include a polymer resin in which the first conductive balls are scattered.

In an embodiment, the conductive adhesive member may include a plurality of second conductive balls and an adhesive resin.

In an embodiment, the conductive adhesive member may overlap with the non-display area and the signal line.

In an embodiment, the signal line may define a conductive pad, and the conductive pad may be electrically connected to the substrate at a pad hole defined in the display layer.

In an embodiment, in the non-display area, the conductive pad, the first conductive balls and the second conductive balls may overlap and be in contact with each other.

In an embodiment, the circuit board may include a bump electrode, the bump electrode may overlap with the first conductive balls and the second conductive balls which are in contact with each other, and the bump electrode may be in contact with the second conductive balls.

In an embodiment, outer side surfaces of the substrate, the conductive adhesive member and the circuit board may be aligned with and in contact with one another.

In an embodiment, the conductive material may be in an entirety of the substrate.

According to an embodiment, the display device includes a substrate including a display area, a non-display area, first and second substrate areas, a display layer on a top surface of the substrate and including a light-emitting element, a signal line extending from the display layer into a second substrate area of the non-display area, a conductive adhesive member on a bottom surface of the second substrate area of the substrate, and a circuit board which is electrically connected to the signal line by contact of the circuit board with the conductive adhesive member, together with contact of the conductive material in the second substrate area with both the signal line and the conductive adhesive member.

In an embodiment, the first and second substrate areas may be in a same plane as each other, and a side surface of the first substrate area may meet a side surface of the second substrate area.

In an embodiment, the second substrate area may define an outer edge of the substrate and overlap with the conductive adhesive member.

In an embodiment, the conductive adhesive member may be spaced apart from the first substrate area and in contact with the second substrate area.

In an embodiment, the light-emitting element may overlap the first substrate area, and may be spaced apart from the second substrate area.

In an embodiment, the second substrate area may be provided in plural including a plurality of second substrate areas spaced apart from one another and each surrounded by the first substrate area.

In an embodiment, the conductive material may include a plurality of first conductive balls, and the substrate may further include a polymer resin in which the first conductive balls are scattered.

In an embodiment, the conductive adhesive member may include a plurality of second conductive balls and an adhesive resin.

In an embodiment, the circuit board may include a bump electrode, the signal line may define a conductive pad, and the bump electrode may be aligned with the conductive pad, the first conductive balls and the second conductive balls.

In an embodiment, the conductive pad may be in contact with the first conductive balls, the first conductive balls may be in contact with the second conductive balls, and the second conductive balls may be in contact with the bump electrode.

In an embodiment, outer side surfaces of the second substrate area, the conductive adhesive member and the circuit board may be aligned with and in contact with one another.

Other features and embodiments may be apparent from the following detailed description, the drawings, and the claims.

BRIEF DESCRIPTION OF THE DRAWINGS

The above and other embodiments and features will become more apparent by describing in detail embodiments thereof with reference to the attached drawings, in which.

DETAILED DESCRIPTION

Figure 1:
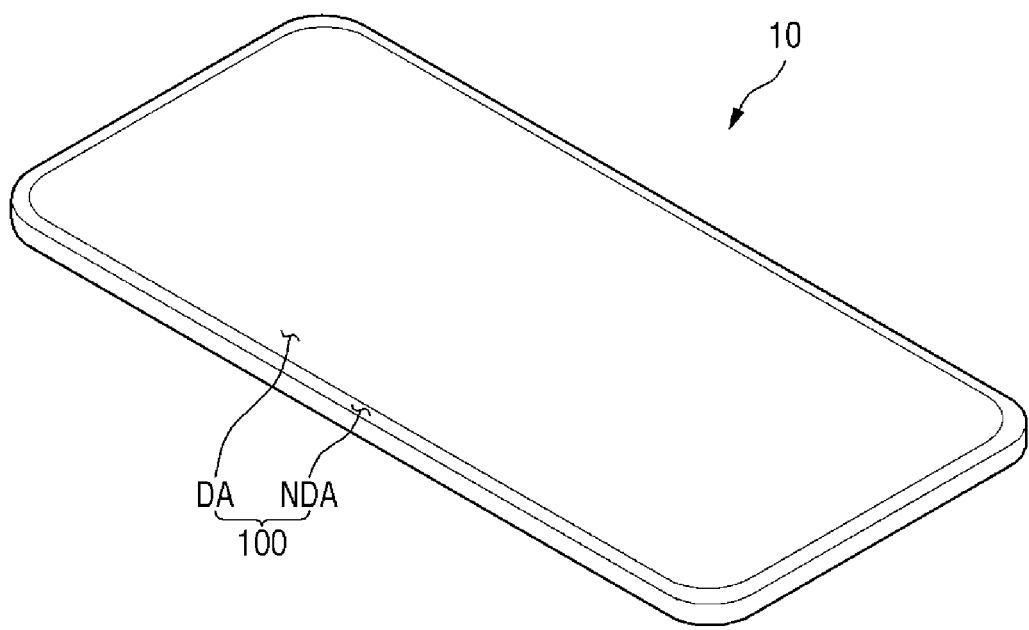
FIG. 1 is a perspective view illustrating an embodiment of the front of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another layer such as being "on" another layer or substrate, it can be directly on the other layer or substrate, or intervening layers may also be present. In contrast, when a layer is referred to as being related to another layer such as being "directly on" another layer or substrate, no other layer or substrate, or intervening layers are present. The same reference numbers indicate the same components throughout the specification.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments will hereinafter be described with reference to the accompanying drawings.

Figure 2:
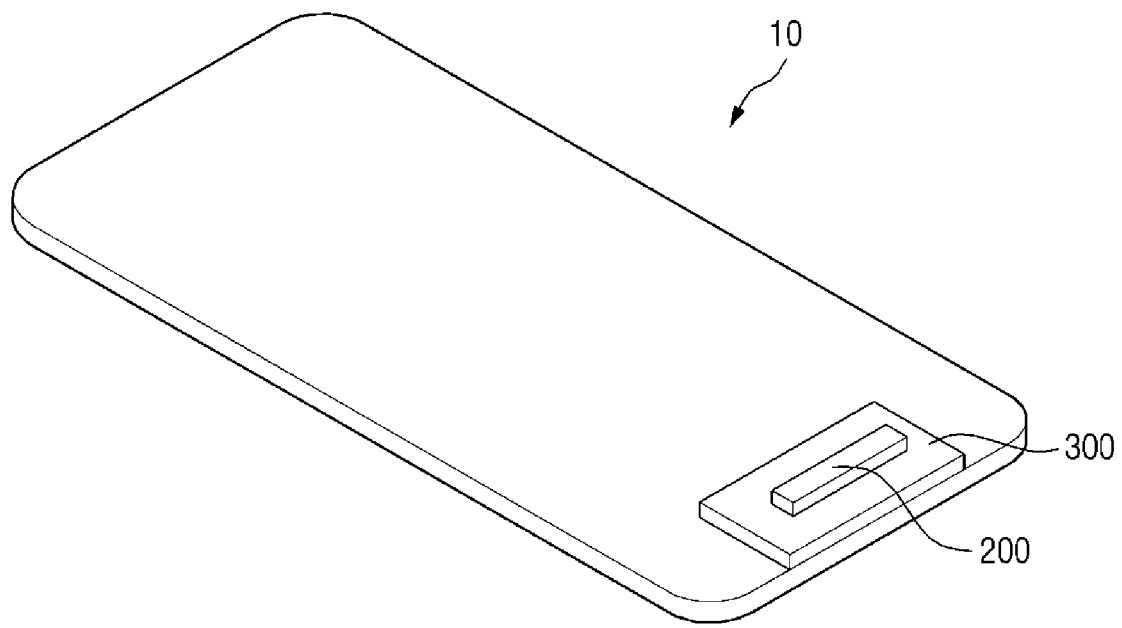
FIG. 2 is a perspective view illustrating an embodiment of the rear of the display device of FIG. 1.
Figure 2:
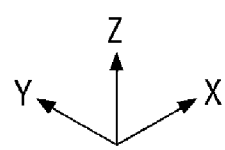

FIG. 1 is a perspective view illustrating an embodiment of the front of a display device 10, and FIG. 2 is a perspective view illustrating an embodiment of the rear of the display device 10 of FIG. 1.

Referring to FIGS. 1 and 2, a display device 10, which is an electronic device displaying a moving image or a still image, may be used not only in a portable electronic device (e.g., a mobile phone, a smartphone, a tablet personal computer ("PC"), a smartwatch, a watchphone, a mobile communication terminal, an electronic notepad, an electronic book, a portable multimedia player ("PMP"), a navigation device, or an ultramobile PC ("UMPC")), but also in various other electronic display products such as a television ("TV"), a notebook computer, a monitor, a billboard, or an Internet-of-Things ("IoT") device.

The display device 10 may include a display panel 100, a display driving circuit 200 and a circuit board 300.

A first direction (or an X-axis direction), which is the direction of the short sides of the display device 10, may be, for example, the horizontal direction of the display device 10. A second direction (or a Y-axis direction), which is the direction of the long sides of the display device 10, may be the vertical direction of the display device 10. A third direction (or a Z-axis direction) may be the thickness direction of the display device 10.

The display panel 100 may have a planar shape such as a rectangular shape having short sides extended along the first direction (or the X-axis direction) and long sides extended along the second direction (or the Y-axis direction), in a plan view (e.g., along the third direction). The corners where the short sides and the long sides of the display panel 100 respectively meet each other may be rounded in the plan view to have a predetermined curvature or may be right-angled in the plan view. The planar shape of the display panel 100 is not particularly limited, and the display panel 100 may have various other shapes such as a polygonal shape, a circular shape or an elliptical shape in the plan view.

The display panel 100 may be flat, such as disposed in a plane defined by the first direction and the second direction crossing each other, but is not limited thereto. In an embodiment, for example, the display panel 100 may include curved parts at the left and right ends of the display panel 100 along the first direction and/or the second direction, and have a uniform or varying curvature. The display panel 100 may be flexible such as being foldable, bendable and/or rollable.

The display panel 100 may be a light-emitting display panel including light-emitting elements. In an embodiment, for example, the display panel 100 may be an organic light-emitting diode ("OLED") display panel using OLEDs having organic light-emitting layers, a micro-light-emitting diode ("micro-LED") display panel using micro-LEDs, a quantum-dot light-emitting diode ("QLED") display panel including quantum-dot light-emitting layers, or an inorganic light-emitting diode ("ILED") display panel using ILEDs including an inorganic semiconductor.

The display panel 100 may be a flexible display panel that is foldable, bendable, or rollable. In an embodiment, for example, the display panel 100 may be a foldable display panel that can be folded or unfolded, a curved display panel having a curved display surface, a bent display panel that is bent in all areas thereof except for the display surface, a rollable display panel that can be rolled or unrolled, or a stretchable display panel that can be stretched. Alternatively, the display panel 100 may be a transparent display panel that is transparent so that an object or a background outside of the display panel 100 at the rear thereof can be seen from the front thereof. Still alternatively, the display panel 100 may be a reflective display panel that can reflect an object or a background at the front thereof.

The display panel 100 may include a display area DA at which an image is displayed, and a non-display area NDA at which the image is not displayed. The non-display area NDA may be adjacent to the display area DA, such as extending around the display area DA in a plan view. The display area DA may include pixels which display an image (e.g., display pixels or display elements). The non-display area NDA may be defined as a planar area that extends between the sides of the display area DA and an outer side surface or outer edge of the display panel 100. The display panel 100 and various components or elements of the display panel 100 and/or the display device 10 may include a display area DA and a non-display area NDA corresponding to those described above.

Referring to FIG. 2, the display driving circuit 200 may be provided on the circuit board 300.

The display driving circuit 200 may generate electrical signals and electrical voltages for driving and/or controlling the display panel 100. The display driving circuit 200 may be an integrated circuit ("IC") which is attached to the circuit board 300, such as in a chip-on-film ("COF") manner. Alternatively, the display driving circuit 200 may be attached to the display panel 100, such as in a chip-on-glass ("COG") or chip-on-plastic ("COP") manner or via ultrasonic bonding, to be attached to the circuit board 300 to reduce the size of the non-display area NDA.

The circuit board 300 may be attached to the display panel 100 at a first end and at the rear thereof, via a conductive adhesive member CAM. As a result, the circuit board 300 may be electrically connected to both the display panel 100 and the display driving circuit 200. The display panel 100 and the display driving circuit 200 may receive electronic signals such as digital video data, timing signals and driving voltages via the circuit board 300. The circuit board 300 may be a flexible printed circuit board ("FPCB"), a printed circuit board ("PCB") or a flexible film such as a COF.

The conductive adhesive member CAM may be an anisotropic conductive film ("ACF") including a plurality of conductive members such as a plurality of conductive balls. The conductive adhesive member CAM may include a plurality of conductive balls scattered in an adhesive resin ADR.

Since the circuit board 300 is attached to the rear of the display panel 100 and is within a planar area of the display panel 100 in the plan view, the bezel size of the display device 10 can be reduced by omitting a planar area occupied by the circuit board 300 bent along an outer side surface of the display device 10.

Figure 3:
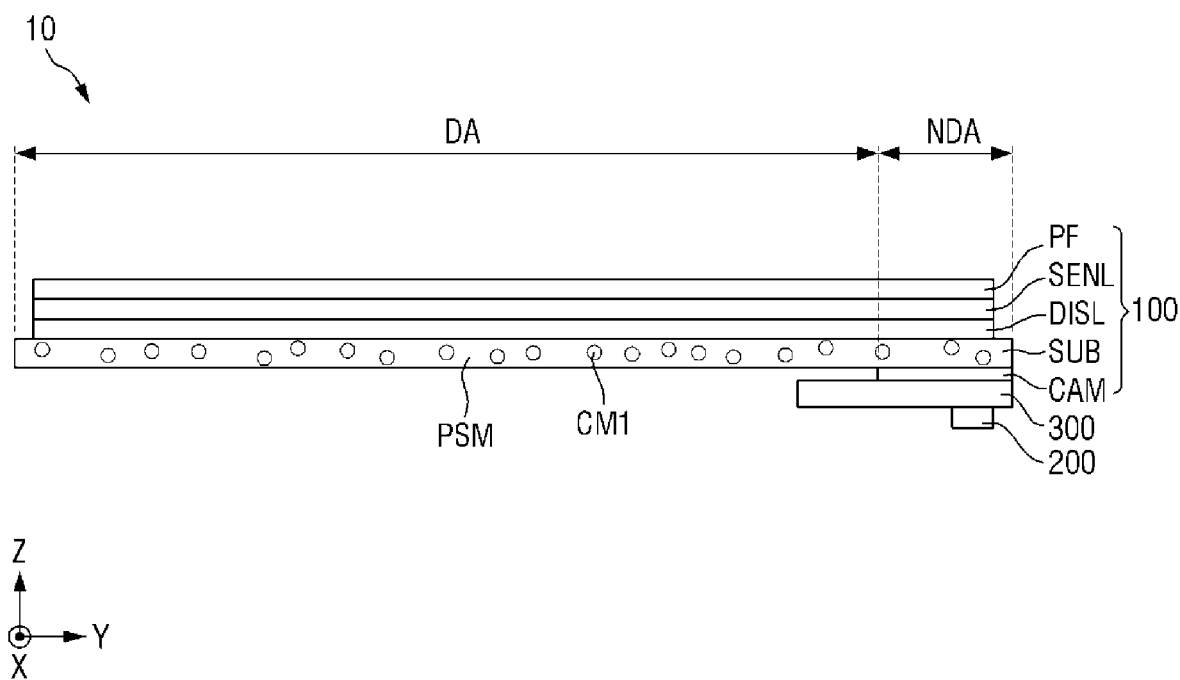
FIG. 3 is a cross-sectional view of an embodiment of the display device of FIG. 1.

FIG. 3 is a cross-sectional view of an embodiment of the display device 10 of FIG. 1.

Referring to FIG. 3, the display panel 100 may include a substrate SUB, a display layer DISL (e.g., image display layer), a sensor electrode layer SENL (e.g., input sensing layer) and a polarizing film PF (e.g., polarizing layer).

The substrate SUB may include or be formed of an insulating material such as a polymer resin PSM. The substrate SUB may be a flexible substrate that is foldable, bendable and/or rollable.

The substrate SUB may include a conductive material. Specifically, the substrate SUB may include a conductive material scattered in the polymer resin PSM. The conductive material may be a first conductive ball CM1 (e.g., first conductive member) provided in plural including a plurality of first conductive balls CM1. The first conductive ball CM1 may be a discrete member which is within the polymer resin PSM and is conductive. Since the substrate SUB includes the first conductive balls CM1, the substrate SUB may function as a conductor under particular conditions. The substrate SUB will be described later in detail.

The display layer DISL may be disposed on the substrate SUB. The display layer DISL may be a layer including light-emitting areas at which an image is displayed. The display layer DISL may include a thin-film transistor ("TFT") layer in which a TFT ST is disposed in plural including a plurality of TFTs ST are disposed, a light-emitting element layer EML in which light-emitting elements 170 that generate and/or emit light are disposed in the light-emitting areas, and an encapsulation layer TFEL which encapsulates the light-emitting element layer EML on the substrate SUB.

At the display area DA, the display layer DISL may include not only the light-emitting areas, but also conductive lines such as a gate signal line GLS, a data signal line DLS and a zo power supply line VDS for driving and/or controlling the light-emitting elements 170. In the non-display area NDA, the display layer DISL may include a scan driving unit which outputs scan signals to the gates signal lines GLS, and fan-out lines which connect the data signal lines DLS and the display driving circuit 200 to each other.

The sensor electrode layer SENL may be disposed on the display layer DISL. The sensor electrode layer SENL may include sensor electrodes SE. The sensor electrode layer SENL may be a layer for detecting touch input with the use of the sensor electrodes SE.

The polarizing film PF may be additionally disposed on the sensor electrode layer SENL. The polarizing film PF may include a first base member, a linear polarizing plate, a phase retardation film such as a quarter-wave (λ/4) plate, and a second base member. The first base member, the phase retardation film, the linear polarizing film, and the second base member may be sequentially stacked on the sensor electrode layer SENL.

A cover window (not shown) may be additionally disposed on the polarizing film PF. The cover window may be attached to the polarizing film PF via an optically clear adhesive ("OCA") film.

A panel bottom cover (not shown) may be additionally disposed below the display panel 100. The panel lower cover may be attached to the bottom surface of the display panel 100 via an adhesive member. The adhesive member may be a pressure sensitive adhesive ("PSA"). The panel bottom cover may include at least one of a light-blocking member for absorbing incident light from outside the display device 10, a buffer member for absorbing shock from the outside, and a heat dissipation member for efficiently releasing heat from the display panel 100.

The circuit board 300 to which the display driving circuit 200 is attached, may be disposed below the display panel 100. The circuit board 300 may be attached to the bottom surface of the substrate SUB via the conductive adhesive member CAM.

Attachment of the circuit board 300 to the substrate SUB may include heat-pressing so that the first conductive balls CM1 of the substrate SUB and second conductive balls CM2 of the conductive adhesive member CAM may be pressed into contact with each other and may thus be electrically connected to a plurality of lines disposed on the substrate SUB. As used herein, elements which are in contact with each other, may form an interface therebetween, without being limited thereto. This will be described later in detail.

Figure 4:
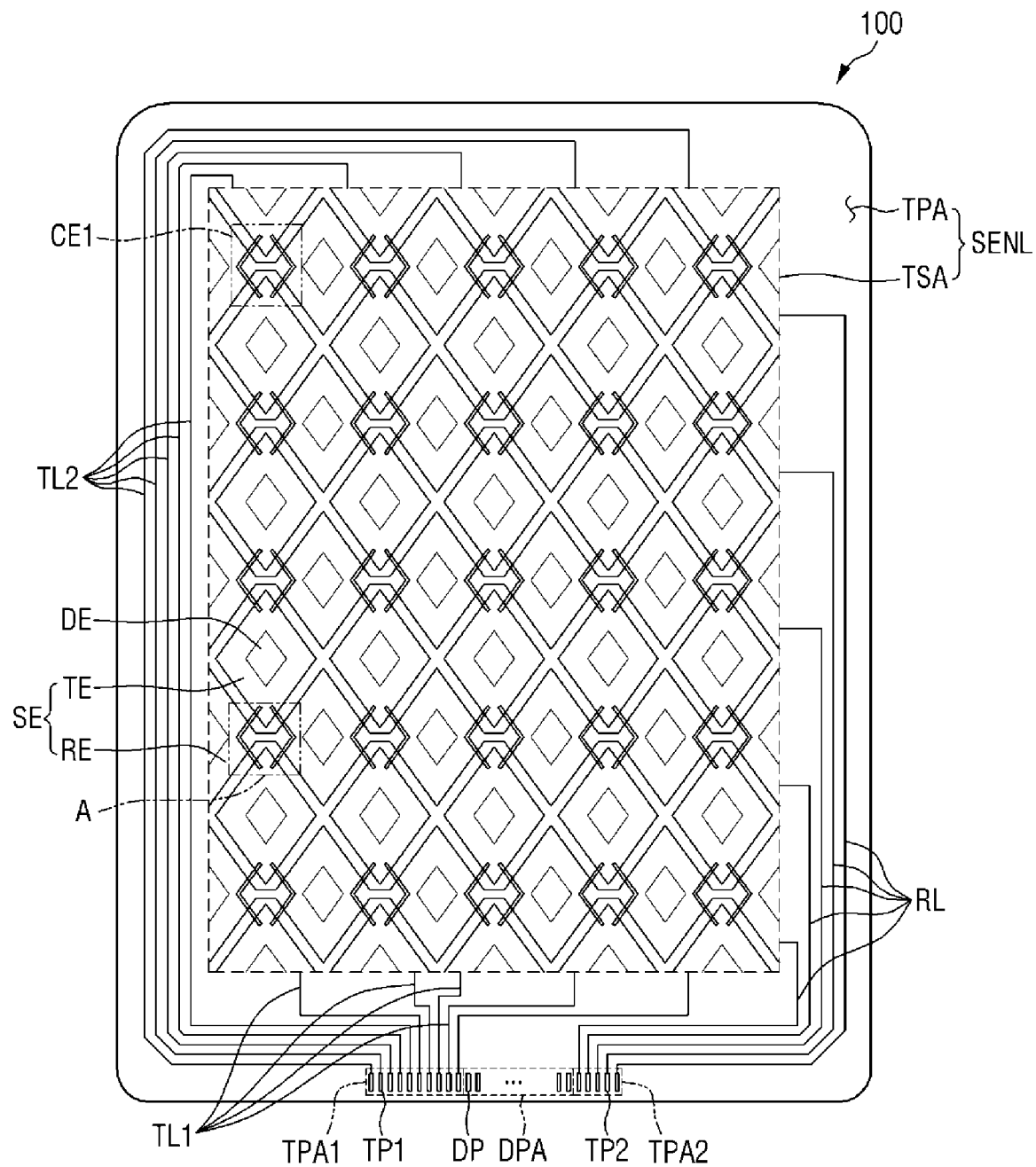
FIG. 4 is a plan view illustrating an embodiment of a sensor electrode layer of the display device of FIG. 1.

FIG. 4 is a plan view illustrating an embodiment of the sensor electrode layer SENL of the display device 10 of FIG. 1.

Referring to FIG. 4, a sensor electrode SE may be provided in plural including sensor electrodes SE in the sensor electrode layer SENL. The sensor electrodes SE may include two types of electrodes, for example, a driving electrode TE and a sensing electrode RE. Within the sensor electrode layer SENL, the driving electrode TE and the sensing electrode RE may be provided in plural including a plurality of driving electrodes TE and a plurality of sensing electrodes RE. The sensor electrodes SE may be driven in a mutual-capacitance manner by applying driving signals to the driving electrodes TE and detecting voltages from the sensing electrodes RE which charge mutual capacitors, but is not limited thereto.

For convenience, FIG. 4 illustrates only driving electrodes TE, sensing electrodes RE, a dummy pattern DE provided in plural including a plurality of dummy patterns DE, a plurality of sensor lines SL, a first sensor pad TP1 provided in plural including a plurality of first sensor pads TP1, and a second sensor pad TP2 provided in plural including a plurality of second sensor pads TP2. A touch driving circuit (not shown) may be connected to the sensor electrode layer SENL at the first sensor pads TP1 and the second sensor pads TP2. The display pads PD, the first sensor pads TP1 and the second sensor pads TP2 may each be a conductive pad.

Referring to FIG. 4, the sensor electrode layer SENL includes a touch sensing area TSA at which an external input is detected, and a touch peripheral area TPA at which an external input is not detected and which is adjacent to the touch sensing area TSA (e.g., non-sensing area). In an embodiment, the touch sensing area TSA may surround the touch peripheral area TPA. The touch sensing area TSA may overlap with the display area DA of the display layer DISL, and the touch peripheral area TPA may overlap with the non-display area NDA of the display layer DISL.

The touch sensing area TSA may include sensor electrodes SE and dummy patterns DE. The sensor electrodes SE may be electrodes with which mutual capacitors are provided to detect an external input, such as from an object or a user which is external to the display device 10 and/or the display panel 100 (e.g., an input tool).

The sensor electrodes SE may include driving electrodes TE and sensing electrodes RE. A sensing line RL may be provided in plural including sensing lines RL, a first driving line TL1 may be provided in plural including first driving lines TL1, and a second driving line TL2 may be provided in plural including second driving lines TL2, in the touch peripheral area TPA. In an embodiment, the sensing electrodes RE may be defined as first sensor electrodes and the driving electrodes TE may be defined as second sensor electrodes, in which case, sensing lines RL may be defined as first sensor lines, and first driving lines TL1 and second driving lines TL2 may be defined as second sensor lines. Alternatively, the driving electrodes TE may be defined as first sensor electrodes and the sensing electrodes RE may be defined as second sensor electrodes, in which case, the first driving lines TL1 and the second driving lines TL2 may be defined as first sensor lines, and the sensing lines RL may be defined as first sensor lines.

The sensing electrodes RE may be arranged in parallel along the first direction (or the X-axis direction) and along the second direction (or the Y-axis direction). The sensing electrodes RE may be electrically connected to each other along the first direction (or the X-axis direction). Pairs of sensing electrodes RE which are adjacent to each other along the first direction (or the X-axis direction) may be connected to each other. Pairs sensing electrodes RE which are adjacent to each other along the second direction (or the Y-axis direction) may be electrically isolated from each other.

The driving electrodes TE may be arranged in parallel along the first direction (or the X-axis direction) and along the second direction (or the Y-axis direction). The driving electrodes TE may be electrically connected to each other along the second direction (or the Y-axis direction). Pairs of driving electrodes TE which are adjacent to each other along the second direction (or the Y-axis direction) may be connected to each other. Pairs of driving electrodes TE which are adjacent to each other along the second direction (or the Y-axis direction) may be connected to each other via a first connecting portion CE1. The first connecting portion CE1 may be provided in plural including a plurality of first connecting portions CE1.

The first connecting portions CE1 may have a planar shape which is bent at least once in the plan view. FIG. 4 illustrates that each of the first connecting portions CE1 has the shape of an angled bracket (such as "<" or ">"), but the planar shape of the first connecting portions CE1 is not particularly limited. Since multiple pairs of driving electrodes TE which are adjacent to each other along the second direction (or the Y-axis direction) are connected by multiple first connecting portions CE1, the driving electrodes TE can be stably connected to each other along the second direction (or the Y-axis direction), even if one of the first connecting portions CE1 is disconnected. FIG. 4 illustrates that two driving electrodes TE which are adjacent to each other along the second direction are connected to each other by one of the connecting portion CE1 including two angled brackets, but the number of the connecting portions CE1 is not particularly limited.

Due to the presence of the first connecting portions CE1, the driving electrodes TE and the sensing electrodes RE can be electrically isolated at the intersections therebetween. As a result, mutual capacitances can be provided or formed between the driving electrodes TE and the sensing electrodes RE.

Referring to FIG. 4, a planar shape of the dummy patterns DE may be surrounded by the planar shape of the driving electrodes TE or the sensing electrodes RE. The dummy patterns DE may be electrically isolated from the driving electrodes TE or the sensing electrodes RE. The dummy patterns DE may be spaced apart from the driving electrodes TE or the sensing electrodes RE. The dummy patterns DE may be electrically floated.

FIG. 4 illustrates that the driving electrodes TE, the sensing electrodes RE and the dummy patterns DE each having a rhombus shape in a plan view, but is not limited thereto. Alternatively, the driving electrodes TE, the sensing electrodes RE and/or the dummy patterns DE may have various other planar shapes other than a rhombus shape such as a rectangular shape, a polygonal shape, a circular shape or an elliptical shape, in a plan view.

The plurality of sensor lines SL may be disposed in the touch peripheral area TPA. The plurality of sensor lines SL may include the sensing lines RL which are connected to the sensing electrodes RE, and the first driving lines TL1 and the second driving lines TL2, which are connected to the driving electrodes TE. The sensing lines RL may be defined as the first sensor lines, and the first driving lines TL1 and the second driving lines TL2 may be defined as the second sensor lines.

Sensing electrodes RE disposed on one side of the touch sensing area TSA may be connected one-to-one to the sensing lines RL. In an embodiment, for example, referring to FIG. 4, a group of the sensing electrodes RE that are electrically connected to each other along the first direction (or the X-axis direction) may be connected to a sensing line RL at the right end of the touch sensing area TSA. A second sensor pad TP2 may be provided in plural in the touch peripheral area TPA, including a plurality of second sensor pads TP2. The sensing lines RL may be connected one-to-one to the second sensor pads TP2. Accordingly, the touch driving circuit can be electrically connected to the sensing electrodes RE at the second sensor pads TP2.

A group of the driving electrodes TE that are electrically connected to each other along the second direction (or the Y-axis direction) may be connected to a first driving line TL1 at a first side of the touch sensing area TSA, and may be connected to a second driving line TL2 at a second side of the touch sensing area TSA which is opposite to the first side thereof. Referring to FIG. 4, for example, a group of driving electrodes TE may be connected to the first driving line TL1 at the lower end (e.g., first side) of the touch sensing area TSA and to the second driving line TL2 at the upper end (e.g., second side) of the touch sensing area TSA. The second driving lines TL2 may be connected to the driving electrodes TE on the upper side of the touch sensing area TSA via the outer left side of the touch sensing area TSA.

The first driving lines TL1 and the second driving lines TL2 may be respectively connected one-to-one to first sensor pads TP1. Accordingly, the touch driving circuit can be electrically connected to the driving electrodes TE at the first sensor pads TP1. Since the driving electrodes TE are connected to the first driving lines TL1 and the second driving lines TL2 at respective sides side of the touch sensing area TSA and each receive touch driving signals, electrical differences due to resistive-capacitive ("RC") delays in touch driving signals, between the touch driving signals applied to driving electrodes TE disposed on a lower side of the touch sensing area TSA and the touch driving signals applied to driving electrodes TE disposed on an upper side of the touch sensing area TSA, may be reduced or effectively prevented.

The touch peripheral area TPA further includes a display pad area DPA in which a display pad PD provided in plural including a plurality of display pads PD is disposed. The display pads DP may be connected to data signal lines DLS in the display area DA of the display panel 100.

The first sensor pad area TPA1 may be provided at a first end of the display pad area DPA including the display pads DP and include the first sensor pads TP1. A second sensor pad area TPA2 may be provided at a second end of the display pad area DPA which is opposite to the first end thereof, and include the second sensor pads TP2. The first sensor pad area TPA1, the display pad area DPA and the second sensor pad area TPA2 may together form a pad area of the display panel 100.

The display pad area DPA, the first sensor pad area TPA1 and the second sensor pad area TPA2 and elements thereof may be disposed on a first surface of the substrate SUB, at the lower side of the display panel 100 along the second direction, in the plan view. The circuit board 300 may be disposed on a second surface (e.g., rear surface) of the substrate SUB which is opposite to the first surface along a thickness direction of the display device 10, to correspond to each of the display pads DP, the first sensor pads TP1 and the second sensor pads TP2. The display pads DP, the first sensor pads TP1 and the second sensor pads TP2 may face the circuit board 300 with the substrate SUB and the conductive adhesive member CAM therebetween. The display pads DP, the first sensor pads TP1 and the second sensor pads TP2 may be electrically connected to the circuit board 300, via the substrate SUB together with the conductive adhesive member CAM.

As illustrated in FIG. 4, the touch sensing area TSA may include the driving electrodes TE and the sensing electrodes RE. Accordingly, the presence of an object or touch input from outside the display device 10 and/or the display panel 100 can be detected using mutual capacitances between the driving electrodes TE and the sensing electrodes RE.

Figure 5:
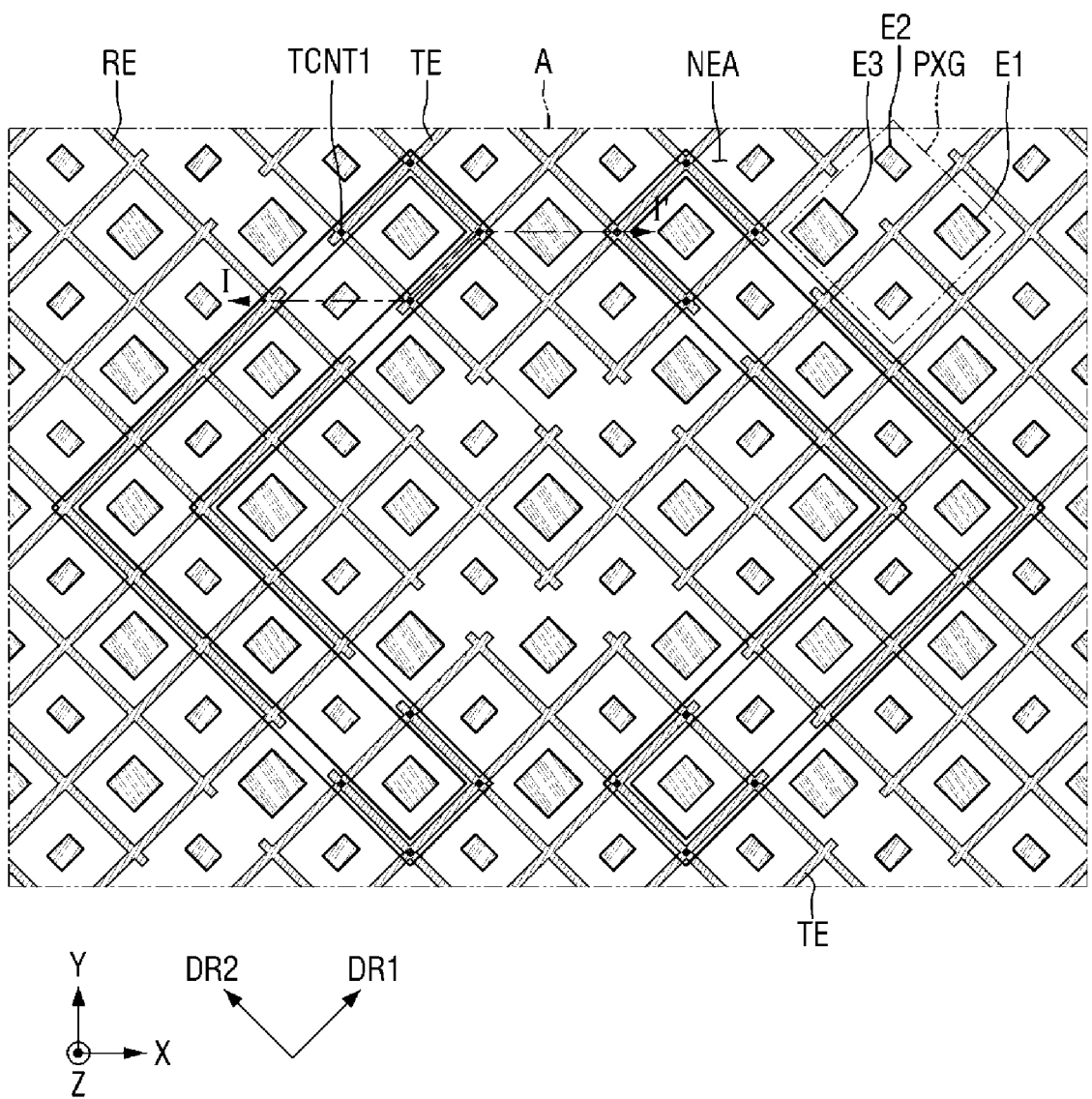
FIG. 5 is a plan view illustrating an embodiment of driving electrodes, sensing electrodes and first connecting portions of FIG. 4.

FIG. 5 is an enlarged plan view illustrating an embodiment of the driving electrodes TE, the sensing electrodes RE and the first connecting portions CE1 of FIG. 4. Specifically, FIG. 5 is an enlarged plan view of area A of FIG. 4.

Referring to FIG. 5, the driving electrodes TE, the sensing electrodes RE and the dummy patterns DE may be disposed in a same layer as each other and spaced apart from one another in a direction along the substrate SUB. That is, gaps may be provided or formed between the driving electrodes TE and the sensing electrodes RE which are spaced apart from one another. Also, in the direction along the substrate SUB, gaps may be provided or formed between the driving electrodes TE and the dummy patterns DE and between the sensing electrodes RE and the dummy patterns DE. Elements which are in a same layer, may be respective portions or respective patterns of a same material layer.

The first connecting portions CE1 may be disposed in a different layer from the driving electrodes TE and the sensing electrodes RE. The first connecting portions CE1 may overlap along the third direction (or the Z-axis direction) with respective pairs of driving electrodes TE which are adjacent to each other along the second direction (or the Y-axis direction) and connected to each other by the first connecting portions CE1. The first connecting portions CE1 may not overlap with the sensing electrodes RE along the third direction (or the Z-axis direction). A first end of each of the first connecting portions CE1 may be connected to one of a pair of driving electrodes TE which are adjacent to each other along the second direction (or the Y-axis direction), via a first touch contact hole TCNT1 (e.g., contact hole), and a second end of each of the first connecting portions CE1 may be connected to the other one of the pair of driving electrode TE, via another one of the first touch contact hole TCNT1.

The driving electrodes TE, the sensing electrodes RE and the first connecting portions CE1 may each be provided or formed in a mesh or fishnet structure, in a plan view. Also, the dummy patterns DE may be provided or formed in a mesh or fishnet structure in, a plan view. The mesh or fishnet structure may be defined by solid portions which define openings therebetween.

Accordingly, the driving electrodes TE, the sensing electrodes RE, the first connecting portions CE1 and the dummy patterns DE may not overlap with emission areas (e.g., light emission areas) at which light is emitted from the display panel 100. In detail, the solid portions of the driving electrodes TE, the sensing electrodes RE, the first connecting portions CE1 and the dummy patterns DE may not overlap with emission areas. Thus, a decrease of the luminance of light emitted from the emission areas can be reduced or effectively prevented since the emission areas are not blocked by the solid portions of the driving electrodes TE, the sensing electrodes, the first connecting portions CE1 and the dummy patterns DE.

Alternatively, the driving electrodes TE, the sensing electrodes RE, the first connecting portions CE1 and the dummy patterns DE may be provided or formed as surfaces (e.g., single solid portion), rather than in a mesh or fishnet structure, in a plan view. In order to prevent a decrease in the luminance of light emitted from the emission areas due to the solid portion of the driving electrodes TE, the sensing electrodes, the first connecting portions CE1 and the dummy patterns DE, a material of the driving electrodes TE, the sensing electrodes RE, the first connecting portions CE1 and the dummy patterns DE may include a transparent conductive material such as indium tin oxide ("ITO") or indium zinc oxide ("IZO").

The emission areas may include a first emission area E1 provided in plural including first emission areas E1 which emit light of a first color, a second emission area E2 provided in plural including second emission areas E2 which emit light of a second color different from the first color, and a third emission area E3 provided in plural including third emission areas E3 which emit light of a third color different from the first color and the second color. In an embodiment, for example, the first color may be red, the second color may be green, and the third color may be blue. The emission areas may respectively correspond to display pixels in the display area DA, without being limited thereto.

The first emission areas E1, the second emission areas E2 and the third emission areas E3 may each have a rhombus or rectangular shape in a plan view, but is not limited thereto. Alternatively, the first emission areas E1, the second emission areas E2 and the third emission areas E3 may have various other planar shapes other than a rectangular shape, such as a polygonal shape, a circular shape or an elliptical shape in a plan view.

Each of the first emission areas E1, the second emission areas E2 and the third emission areas E3 has a size in the plan view (e.g., a planar size). Among sizes of the first emission areas E1, the second emission areas E2 and the third emission areas E3, FIG. 5 illustrates that the size of the third emission areas E3 is largest size and the size of the second emission areas E2 is smallest, but is not limited thereto.

One of the first emission area E1, two of the second emission areas E2, and one of the third emission area E3 may be defined as a pixel emission group PXG which emits light to represent a white gradation. That is, white gradation can be represented by light emitted from one of the first emission area E1, light emitted from two of the second emission areas E2, and light emitted from one of the third emission area E3.

The emission areas may be arranged in rows extended along the first direction (or the X-axis direction) and columns extended along the second direction (or the Y-axis direction). Each emission area may have sides which define outer edges of the emission area. The sides may extend inclined with respect to the first direction (or the X-axis direction) and/or the second direction (or the Y-axis direction).

The second emission areas E2 may be arranged in odd-numbered rows. The second emission areas E2 may be arranged side-by-side along the first direction (or the X-axis direction) within the odd-numbered rows. The second emission areas E2 arranged side-by-side along the first direction may form a group of emission areas. In each of the odd-numbered rows, one of each pair of second emission areas E2 which are adjacent to teach other along the first direction (or the X-axis direction) may have long sides extended along a first inclined direction DR1 and short sides extended along a second inclined direction DR2. However, the other one of each pair of second emission areas E2 may have long sides extended along the second inclined direction DR2 and short sides extended along the first inclined direction DR1. The first inclined direction DR1 may be a direction between the first direction (or the X-axis direction) and the second direction (or the Y-axis direction), and the second inclined direction DR2 may be a direction that intersects the first inclined direction DR1.

The first emission areas E1 and the third emission areas E3 may be arranged in even-numbered rows. The first emission areas E1 and the third emission areas E3 may be arranged side-by-side along the first direction (or the X-axis direction) within the even-numbered rows. The first emission areas E1 arranged side-by-side along the first direction may form a group of emission areas, and the third emission areas E3 arranged side-by-side along the first direction may form a group of emission areas. The first emission areas E1 and the third emission areas E3 may be alternately arranged in the even-numbered rows.

The second emission areas E2 may be arranged in odd-numbered columns. The second emission areas E2 may be arranged side-by-side along the second direction (or the Y-axis direction) within the odd-numbered columns. In each of the odd-numbered columns, one of each pair of second emission areas E2 which are adjacent to each other along the second direction (or the Y-axis direction) may have long sides extended along the first inclined direction DR1 and short sides extended along the second inclined direction DR2. However, the other of each pair of second emission areas E2 may have long sides extended along the second inclined direction DR2 and short sides extended along the first inclined direction DR1.

The first emission areas E1 and the third emission areas E3 may be arranged in even-numbered columns. The first emission areas E1 and the third emission areas E3 may be arranged side-by-side within the even-numbered columns. The first emission areas E1 and the third emission areas E3 may be alternately arranged along the even-numbered columns.

Figure 6:
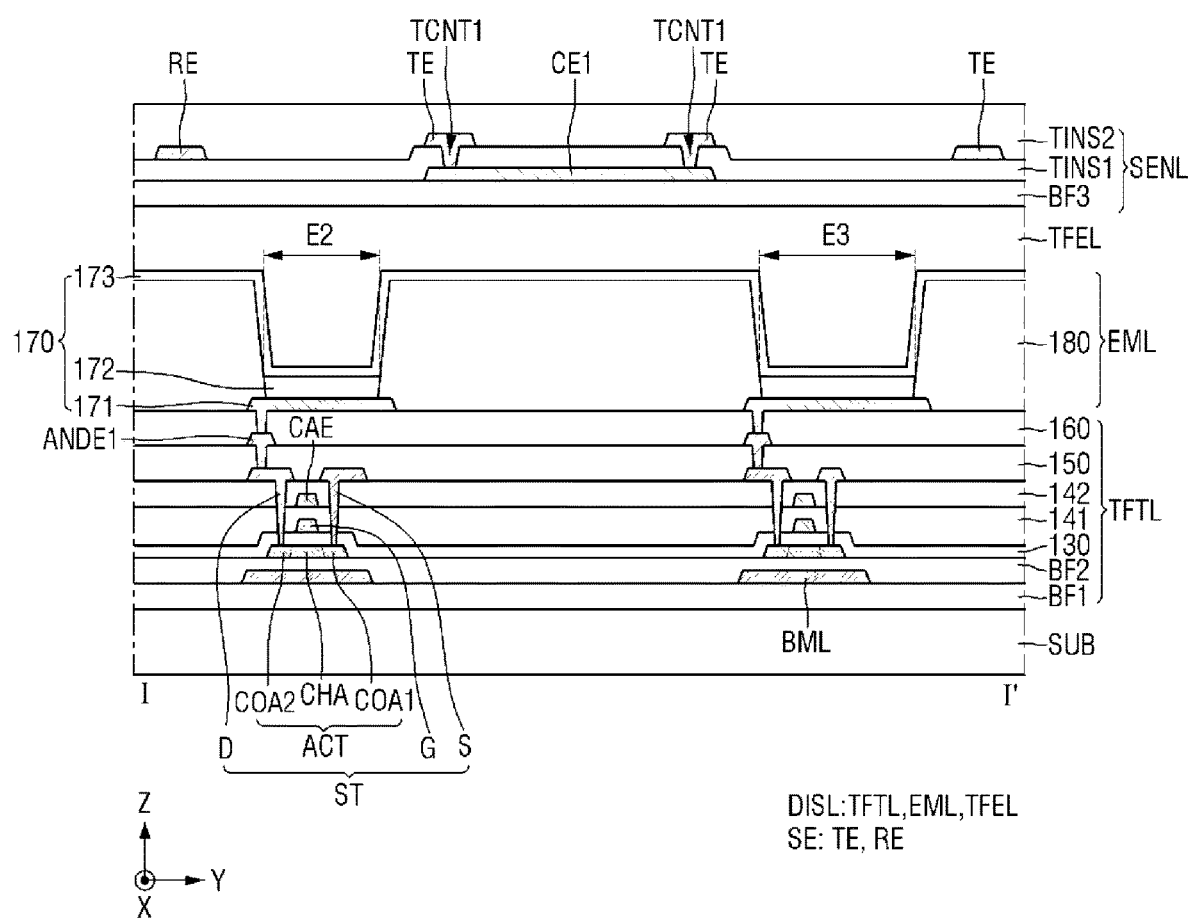
FIG. 6 is a cross-sectional view taken along line I-I' of FIG. 5.

FIG. 6 is a cross-sectional view taken along line I-I' of FIG. 5.

Referring to FIG. 6, the display layer DISL, which includes a TFT layer TFTL, a light-emitting element layer EML and an encapsulation layer TFEL, may be disposed in order on a substrate SUB. The sensor electrode layer SENL, which includes the sensor electrodes SE, may be disposed on the display layer DISL. That is the sensor electrode layer SENL faces the substrate SUB with the display layer DISL therebetween.

A first buffer layer BF1 may be disposed on a first surface of the substrate SUB, and a second buffer layer BF2 may be disposed on the first buffer layer BF1. The first and second buffer layers BF1 and BF2 may be disposed in order on the first surface of the substrate SUB to protect TFTs ST of the TFT layer TFTL and a light-emitting layer 172 (e.g., light-emitting pattern) of the light-emitting element layer EML from moisture that may penetrate through the substrate SUB that is susceptible to moisture.

Each of the first and second buffer layers BF1 and BF2 may include a plurality of inorganic material layers that are stacked along a thickness direction of the display panel 100 (e.g., in a direction away from the substrate SUB). In an embodiment, for example, each of the first and second buffer layers BF1 and BF2 may be formed as a multilayer layer structure in which one or more inorganic material layer selected from among a silicon nitride layer, a silicon oxynitride layer, a silicon oxide layer, a titanium oxide layer, and an aluminum oxide layer are stacked. In an embodiment, one of the first and second buffer layers BF1 and BF2 may be omitted.

A first light blocking layer BML (e.g., first light blocking pattern) may be provided in plural along the substrate SUB, including first light-blocking layers BML disposed on the first buffer layer BF1. The first light-blocking layers BML may include or be formed as a single-layer structure or multilayer layer structure including molybdenum (Mo), aluminum (Al), chromium (Cr), gold (Au), titanium (Ti), nickel (Ni), neodymium (Nd), copper (Cu), or an alloy thereof. Alternatively, the first light-blocking layers BML may be an organic material layer including a black pigment.

An active layer ACT (e.g., active layer pattern) may be provided in plural along the substrate SUB, including active layers ACT of the TFTs ST disposed on the second buffer layer BF2. The active layers ACT may include polycrystalline silicon, monocrystalline silicon, low-temperature polycrystalline silicon ("LTPS"), amorphous silicon or an oxide semiconductor material. In the active layers ACT including polycrystalline silicon or an oxide semiconductor material, ion doped regions of the active layers ACT may be conductive areas with electrical conductivity.

The active layers ACT may overlap with or correspond to the first light-blocking layers BML along the third direction (or the Z-axis direction). Since light incident through the substrate SUB can be blocked by the first light-blocking layers BML, flowing of leakage electrical currents into the active layers ACT due to the incident light can be reduced or effectively prevented.

A gate insulating layer 130 may be provided or formed on the active layers ACT. The gate insulating layer 130 may include be formed as an inorganic material layer such as, for example, a silicon nitride layer, a silicon oxynitride layer, a silicon oxide layer, a titanium oxide layer or an aluminum oxide layer.

A gate electrode G may be provided in plural including gate electrodes G of the TFTs ST disposed on the gate insulating layer 130. The gate electrodes G of the TFTs ST may overlap with or respectively correspond to the active layers ACT along the third direction (or the Z-axis direction). The gate electrodes G may be provided or formed as a single-layer structure or multilayer layer structure including Mo, Al, Cr, Au, Ti, Ni, Nd, Cu or an alloy thereof.

Portions of the active layers ACT that overlap with the gate electrodes G along the third direction (or the Z-axis direction) may be channel areas CHA including a channel area CHA provided in plural. The active layers ACT may include a first conductive area COA1 and a second conductive area COA2 each provided in plural including first conductive areas COA1 and second conductive areas COA2 respectively extending from opposite side of a channel area CHA.

A first interlayer insulating layer 141 may be disposed on the gate electrodes G. The first interlayer insulating layer 141 may be provided or formed as an inorganic material layer such as, for example, a silicon nitride layer, a silicon oxynitride layer, a silicon oxide layer, a titanium oxide layer or an aluminum oxide layer. The first interlayer insulating layer 141 may include a plurality of inorganic material layers.

A capacitor electrode CAE may be provided in plural including capacitor electrodes CAE may be disposed on the first interlayer insulating layer 141. The capacitor electrodes CAE may overlap with or respectively correspond to the gate electrodes G along the third direction (or the Z-axis direction). The capacitor electrodes CAE may be provided or formed as a single-layer structure or multilayer layer structure including Mo, Al, Cr, Au, Ti, Ni, Nd, Cu or an alloy thereof.

A second interlayer insulating layer 142 may be disposed on the capacitor electrodes CAE. The second interlayer insulating layer 142 may be provided or formed as an inorganic material layer such as, for example, a silicon nitride layer, a silicon oxynitride layer, a silicon oxide layer, a titanium oxide layer or an aluminum oxide layer. The second interlayer insulating layer 142 may include a plurality of inorganic material layers.

A first electrode S and a second electrode D may each be provided in plural including first electrodes S and second electrodes D of the TFTs ST disposed on the second interlayer insulating layer 142. The first electrodes S and the second electrodes D may be formed as a single-layer structure or multilayer layer structure including Mo, Al, Cr, Au, Ti, Ni, Nd, Cu or an alloy thereof.

The first electrodes S of the TFTs ST may be respectively connected to first conductive areas COA1 which are disposed extending from first sides of the channel areas CHA of the active layers ACT, through contact holes that penetrate the gate insulating layer 130, the first interlayer insulating layer 141 and the second interlayer insulating layer 142. The second electrodes D of the TFTs ST may be respectively connected to second conductive areas COA2 which are disposed extending from second sides of the channel areas CHA of the active layers ACT, through contact holes that penetrate the gate insulating layer 130, the first interlayer insulating layer 141 and the second interlayer insulating layer 142.

A first organic layer 150 for planarizing height differences formed by the TFTs ST may be disposed on the first electrodes S and the second electrodes D. The first organic layer 150 may be provided or formed as an organic material layer including an acrylic resin, an epoxy resin, a phenolic resin, a polyamide resin or a polyimide resin.

A first connecting electrode ANDE1 (e.g., connecting electrode) may be provided in plural including first connecting electrodes ANDE1 disposed on the first organic layer 150. The first connecting electrodes ANDE1 may be respectively connected to the second electrodes D of the TFTs ST through contact holes that penetrate the first organic layer 150. The first connecting electrodes ANDE1 may be provided or formed as a single-layer structure or multilayer layer structure including Mo, Al, Cr, Au, Ti, Ni, Nd, Cu or an alloy thereof.

A second organic layer 160 may be disposed on the first connecting electrodes ANDE1. The second organic layer 160 may be provided or formed as an organic material layer including an acrylic resin, an epoxy resin, a phenolic resin, a polyamide resin or a polyimide resin.

FIG. 6 illustrates that the TFTs ST are provided or formed as top gate TFTs where the gate electrodes G are disposed above the active layers ACT (e.g., gate electrodes G are disposed further from the substrate SUB than the active layers ACT), but is not limited thereto. Alternatively, the TFTs ST may be formed as bottom gate TFTs where the gate electrodes G are disposed below the active layers ACT (e.g., gate electrodes G are disposed closer to the substrate SUB than the active layers ACT) or as double gate TFTs where a gate electrode G is disposed both above and below the active layers ACT.

The light-emitting element layer EML is disposed on the TFT layer TFTL. The light-emitting element layer EML may include a light-emitting element 170 provided in plural including light-emitting elements 170, and a third organic layer 180, disposed in order from the substrate SUB.

Each of the light-emitting elements 170 may include a first light-emitting electrode 171, a light-emitting layer 172, and a second light-emitting electrode 173. The first light-emitting electrode 171 faces the second light-emitting electrode 173 with the light-emitting layer 172 therebetween. Each of the second emission areas E2 and the third emission areas E3 may be a region in which the first light-emitting electrode 171, the light-emitting layer 172 and the second light-emitting electrode 173 are sequentially stacked along a thickness direction of the display panel 100, so that holes from the first light-emitting element 171 and electrons from the second light-emitting electrode 173 can combine in the light-emitting layer 172 to generate and emit light. In this case, the first light-emitting electrode 171 may be an anode electrode, and the second light-emitting electrode 173 may be a cathode electrode.

The first light-emitting electrode 171 may be provided in plural along the substrate SUB, including first light-emitting electrodes 171 provided or formed on the second organic layer 160. The first light-emitting electrodes 171 may be respectively connected to the first connecting electrodes ANDE1 via contact holes that penetrate the second organic layer 160.

In a top emission structure in which the light-emitting elements 170 emit light in a direction from the light-emitting layers 172 to the second light-emitting electrode 173 of the light-emitting elements 170, the first light-emitting electrodes 171 may be provided or formed as single material layers of Mo, Ti, Cu, or Al or may be provided or formed as stacked material layers of Al and Ti (e.g., Ti/Al/Ti), of Al and ITO (e.g., ITO/Al/ITO), of a silver (Ag)-palladium (Pd)-copper (Cu) (APC) alloy, or of an APC alloy and ITO (e.g., ITO/APC/ITO).

A third organic layer 180 defines the second emission areas E2 and the third emission areas E3. To this end, the third organic layer 180 may be provided or formed on the second organic layer 160 to expose parts of the first light-emitting electrodes 171 of the light-emitting elements 170 at respective emission areas. The third organic layer 180 may cover the edges of each of the first light-emitting electrodes 171. The third organic layer 180 may be provided or formed as an organic material layer including an acrylic resin, an epoxy resin, a phenolic resin, a polyamide resin or a polyimide resin.

Light-emitting layers 172 are respectively provided or formed on the first light-emitting electrodes 171. The light-emitting layers 172 may include an organic material to emit light of a predetermined color. In an embodiment, for example, the light-emitting layers 172 may each include a hole transport layer, an organic material layer and an electron transport layer. The organic material layer may include a host and a dopant. The organic material layer may include a material capable of emitting light of a predetermined color and may include or be formed of a phosphorescent material or a fluorescent material.

In an embodiment, for example, the organic material layers of light-emitting layers 172 provided or formed in the first emission areas E1 (of FIG. 5), which emit light of the first color, may include or be formed of a phosphorescent material including a host material including carbazole biphenyl ("CBP") or 1,3-bis(carbazol-9-yl)benzene ("mCP") and at least one dopant material selected from among bis(1- phenylisoquinoline)acetylacetonate iridium (PIQIr(acac)), bis(1-phenylquinoline)acetylacetonate iridium (PQIr(acac)), tris(1-phenylquinoline)iridium (PQIr) and platinum octaethylporphyrin (PtOEP). In an embodiment, the organic material layers of light-emitting layers 172 provided or formed in the first emission areas E1 (of FIG. 5) may include or be formed of a fluorescent material including PBD:Eu(DBM)$_3$(Phen) or perylene. However, the embodiment is not limited to these examples.

In an embodiment, for example, the organic material layers of light-emitting layers 172 provided or formed in the second emission areas E2, which emit light of the second color, may include or be formed of a phosphorescent material including a host material including CBP or mCP and a dopant material including fac-tris(2-phenylpyridine) iridium) (Ir(ppy)$_3$). In an embodiment, the organic material layers of the light-emitting layers 172 provided or formed in the second emission areas E2 may include or be formed of a fluorescent material including tris(8-hydroxyquinolino) aluminum (Alq$_3$). However, the embodiment is not limited to these examples.

In an embodiment, for example, the organic material layers of light-emitting layers 172 provided or formed in the third emission areas E3, which emit light of the third color, may include or be formed of a phosphorescent material including a host material including CBP or mCP and a dopant material including (4,6-F$_2$ppy)$_2$Irpic or L2BD111. However, the embodiment is not limited to this example.

A second light-emitting electrode 173 may be provided or formed on the light-emitting layers 172. The second light-emitting electrode 173 may be provided or formed to cover the light-emitting layers 172. The second light-emitting electrode 173 may be a common layer corresponding to all of the display pixels. A capping layer (not shown) may be provided or formed on the second light-emitting electrode 173.

In the top emission structure, the second light-emitting electrode 173 may include or be formed of a transparent conductive oxide ("TCO") material such as ITO or IZO or a translucent metallic material such as magnesium (Mg), Ag, or an alloy thereof. The second light-emitting electrode 173 which includes or is formed of a translucent metallic material, provides improved emission efficiency of the light-emitting elements 170, due to micro-cavities.

The light-emitting layers 172 may be disposed on top surfaces of the first light-emitting electrodes 171 and on inclined surfaces of the third organic layer 180. The second light-emitting electrode 173 may be disposed on the top surfaces of the light-emitting layers 172 and on the inclined surfaces of the third organic layer 180. The top surfaces may be surfaces which are furthest from the substrate SUB.

The encapsulation layer TFEL may be provided or formed on the light-emitting element layer EML. The encapsulation layer TFEL may include at least one inorganic material layer to prevent the penetration of oxygen or moisture into the light-emitting element layer EML. The encapsulation layer TFEL may also include at least one organic material layer to protect the light-emitting element layer EML from foreign materials such as dust. The inorganic material layer may be provided or formed as a multilayer layer structure in which one or more inorganic material layers selected from among a silicon nitride layer, a silicon oxynitride layer, a silicon oxide layer, a titanium oxide layer and an aluminum oxide layer are stacked. The organic material layer may include or be formed of an acrylic resin, an epoxy resin, a phenolic resin, a polyamide resin, or a polyimide resin.

The sensor electrode layer SENL is disposed on the encapsulation layer TFEL. The sensor electrode layer SENL may include the sensor electrodes SE.

A third buffer layer BF3 may be disposed on the encapsulation layer TFEL. The third buffer layer BF3 may be a layer having insulation and optical functions. The third buffer layer BF3 may include at least one inorganic material layer. In an embodiment, for example, the third buffer layer BF3 may be provided or formed as a multilayer layer structure in which one or more inorganic material layers selected from among a silicon nitride layer, a silicon oxynitride layer, a silicon oxide layer, a titanium oxide layer and an aluminum oxide layer are stacked. The third buffer layer BF3 may be provided or formed by a lamination process using a flexible material, a spin coating process using a solution-type material, a slit die coating process, or a deposition process. In an embodiment, the third buffer layer BF3 may be omitted.

The first connecting portions CE1 may be disposed on the third buffer layer BF3. The first connecting portions CE1 may be provided or formed as single material layers of Mo, Ti, Cu, or Al or may be formed as stacked material layers of Al and Ti (e.g., Ti/Al/Ti), of Al and ITO (e.g., ITO/Al/ITO), of an APC alloy, or of an APC alloy and ITO (e.g., ITO/APC/ITO).

A first sensor insulating layer TINS1 may be disposed on the first connecting portions CE1. The first sensor insulating layer TINS1 may be a layer having insulation and optical functions. The first sensor insulating layer TINS1 may be provided or formed as an inorganic material layer such as, a silicon nitride layer, a silicon oxynitride layer, a silicon oxide layer, a titanium oxide layer or an aluminum oxide layer. The first sensor insulating layer TINS1 may be provided or formed by a lamination process using a flexible material, a spin coating process using a solution-type material, a slit die coating process, or a deposition process.

The driving electrodes TE and the sensing electrodes RE may be disposed on the first sensor insulating layer TINS1, that is, in a same layer on the first sensor insulating layer TINS1. The driving electrodes TE and the sensing electrodes RE may not overlap with the second emission areas E2 and the third emission areas E3. The driving electrodes TE and the sensing electrodes RE may be provided or formed as single layers of Mo, Ti, Cu, or Al or may be provided or formed as stacked materials layers of Al and Ti (e.g., Ti/Al/Ti), of Al and ITO (e.g., ITO/Al/ITO), of an APC alloy, or of an APC alloy and ITO (e.g., ITO/APC/ITO).

A second sensor insulating layer TINS2 may be disposed on the driving electrodes TE and the sensing electrodes RE. The second sensor insulating layer TINS2 may face the first sensor insulating layer TINS1 with the driving electrodes TE and the sensing electrodes RE therebetween. The second sensor insulating layer TINS2 may be a layer having insulation and optical functions. The second sensor insulating layer TINS2 may include at least one of an inorganic material layer and an organic material layer. The inorganic material layer may be a silicon nitride layer, a silicon oxynitride layer, a silicon oxide layer, a titanium oxide layer or an aluminum oxide layer. The organic material layer may be formed of an acrylic resin, an epoxy resin, a phenolic resin, a polyamide resin or a polyimide resin. The second sensor insulating layer TINS2 may be provided or formed by a lamination process using a flexible material, a spin coating process using a solution-type material, a slit die coating process, or a deposition process. Referring to FIG. 6, the driving electrodes TE and the sensing electrodes RE may be disposed in a same layer as each other and may include or be formed of the same material at the same time so as to be respective portions of a same material layer.

It will hereinafter be described how conductive lines are connected via the substrate SUB, the conductive adhesive member CAM and the circuit board 300 within the display device 10.

Figure 7:
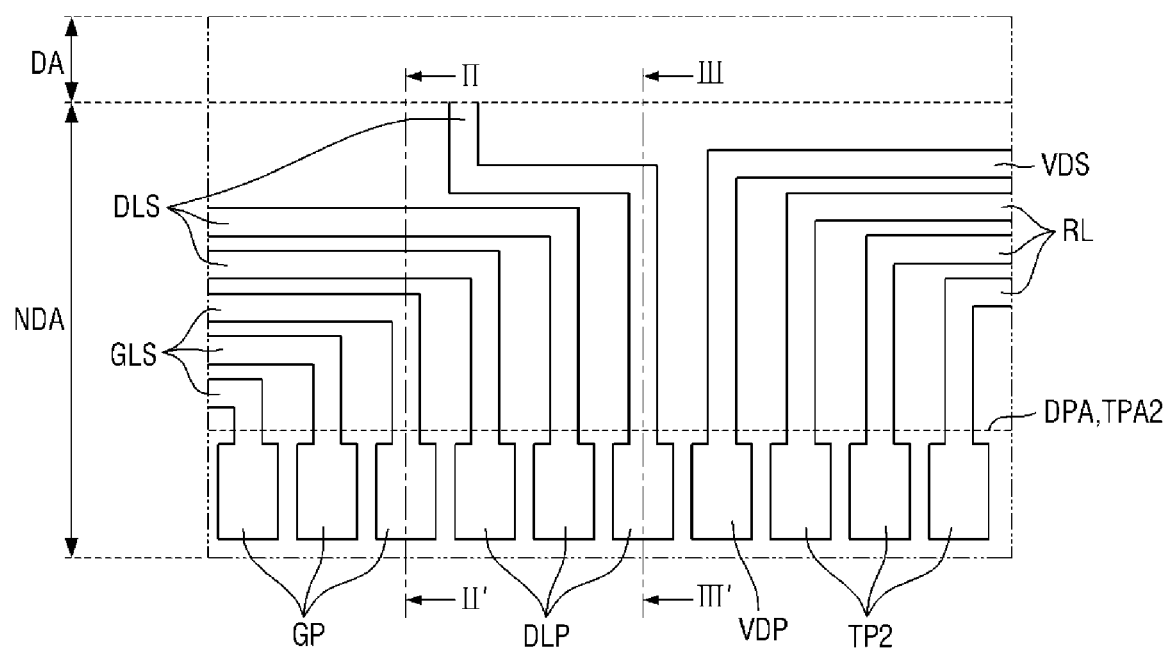
FIG. 7 is a plan view illustrating an embodiment of a display pad area of the display device of FIG. 1.
Figure 8:
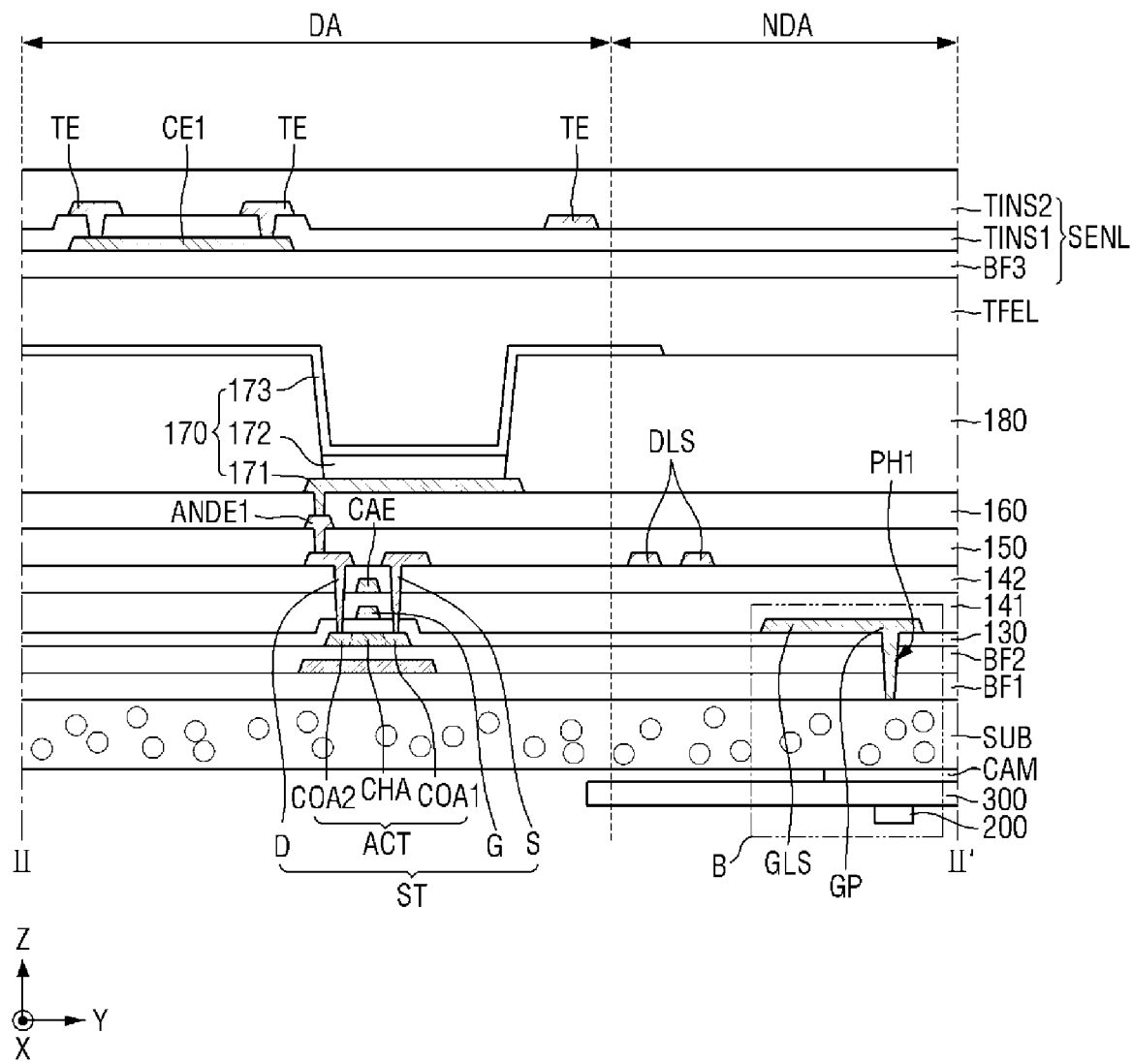
FIG. 8 is a cross-sectional view taken along line II-II' of FIG. 7.
Figure 9:
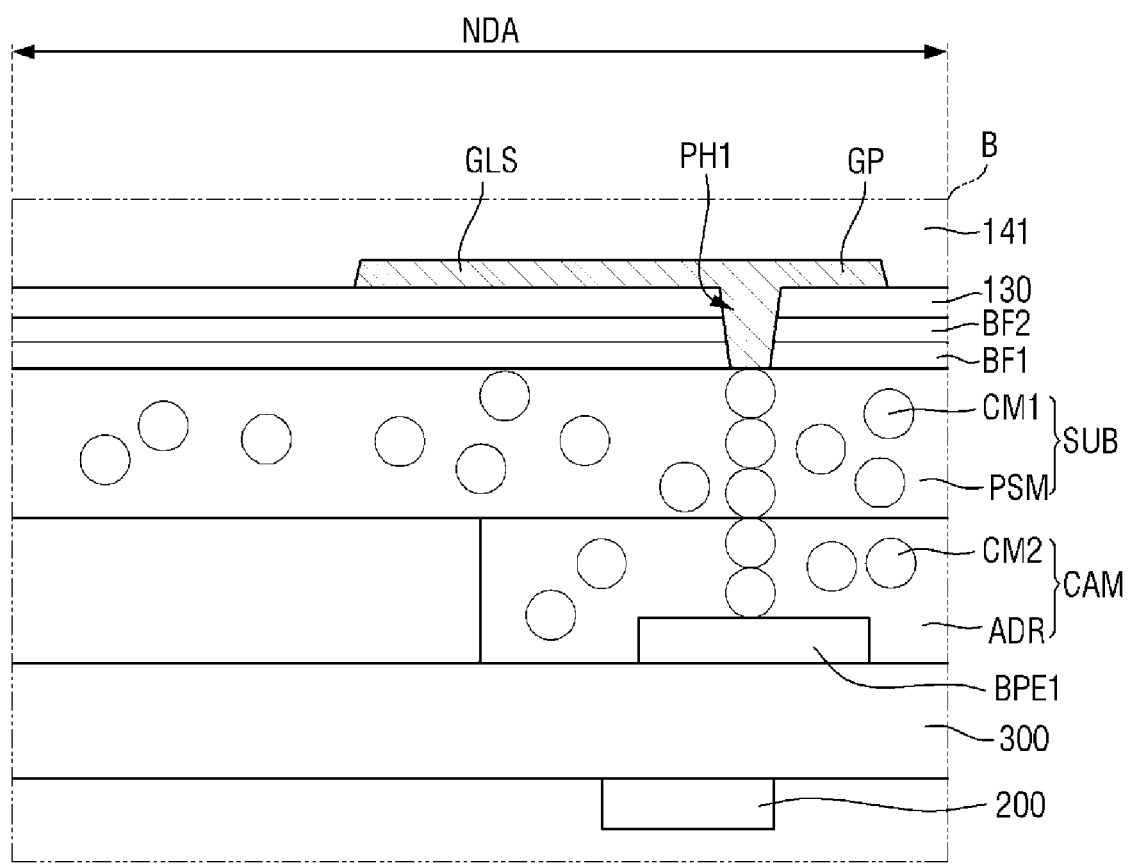
FIG. 9 is an enlarged cross-sectional view illustrating an embodiment of area B of FIG. 8.
Figure 10:
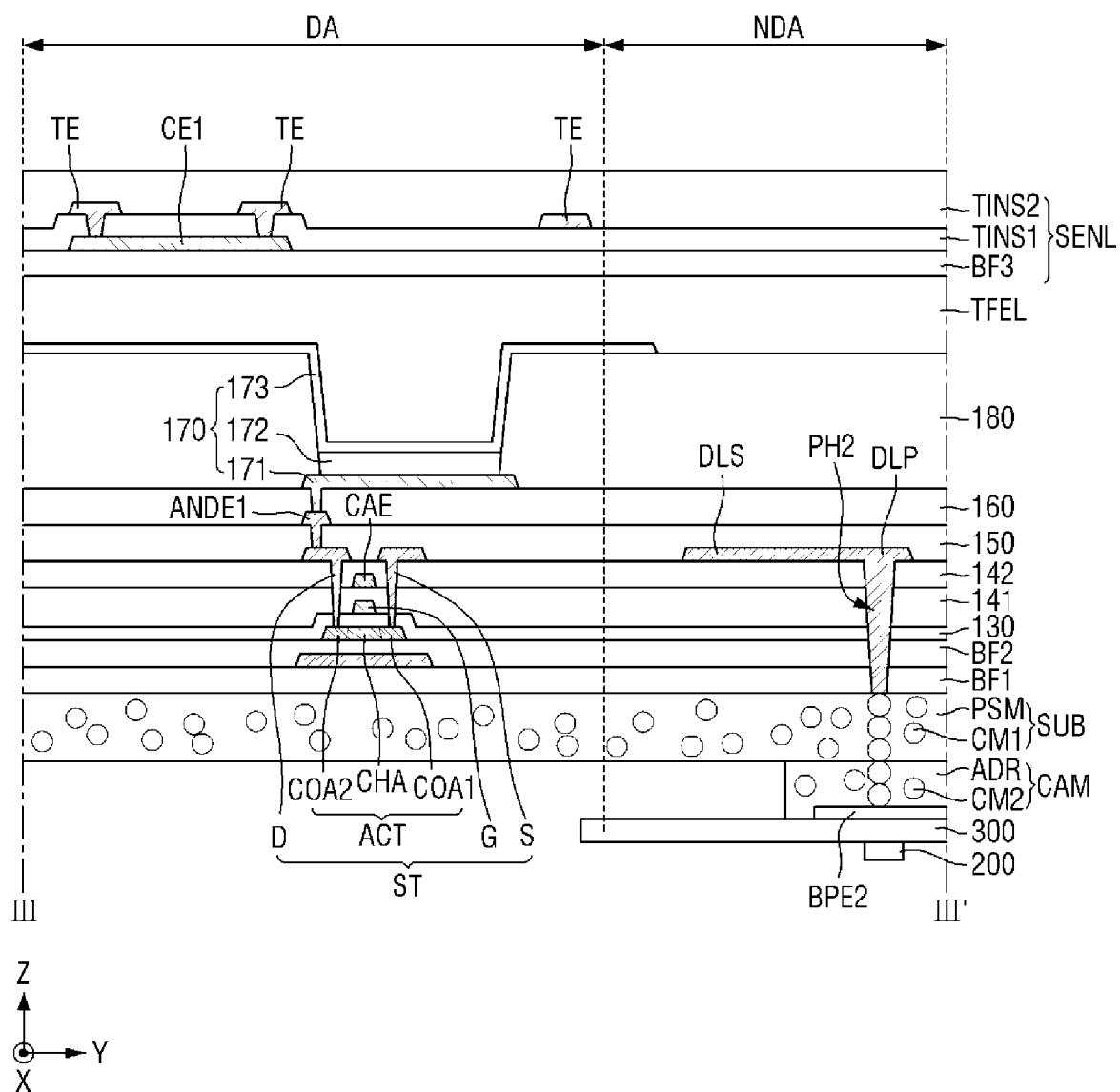
FIG. 10 is a cross-sectional view taken along line III-III' of FIG. 7.

FIG. 7 is a plan view illustrating an embodiment of a pad area of the display device 10 of FIG. 1. FIG. 8 is a cross-sectional view taken along line II-II' of FIG. 7. FIG. 9 is an enlarged cross-sectional view illustrating an area B of FIG. 8. FIG. 10 is a cross-sectional view taken along line of FIG. 7.

Referring to FIG. 7, the pad area may be disposed in the non-display area NDA of the substrate SUB. A signal line which is provided in plural including a plurality of lines disposed in the display area DA may extend from the display area DA to the non-display area NDA, to dispose distal ends of the plurality of lines in the display pad area DPA. The distal ends of the plurality of lines may respectively define a conductive pad in the non-display area NDA. The plurality of lines may include a gate signal line GLS provided in plural including gate signal lines GLS and a data signal line DLS provided in plural including data signal lines DLS.

The non-display area NDA may further include a plurality of lines including a power supply line VDS and the sensing lines RL. The plurality of lines may extend into the pad area from a portion of the non-display area NDA which excludes the pad area. In an embodiment, the sensing lines RL may extend into the second sensor pad area TPA2. The power supply line VDS may extend into the display pad area DPA or the second sensor pad area TPA2. FIG. 7 illustrates only a portion of the pad area, and various lines other than those illustrated in FIG. 7 may also be disposed in the pad area.

The gate signal lines GLS may extend from gate signal lines GLS in the display area DA and may be conductive lines through which electrical signals such as gate signals are applied to the display pixels in the display area DA. The data signal lines DLS may extend from data signal lines DLS in the display area DA and may be conductive lines through which electrical signals such as data signals are applied to the display pixels in the display area DA.

The power supply line VDS may extend from a first power line (e.g., a power line) in the display area DA and may be a conductive line through which an electrical signal such as a power supply voltage is applied to the display area DA. The sensing lines RL may extend from sensing electrodes RE in the display area DA and may be conductive lines through which electrical signals such as touch sensing signals are applied to and/or from the display area DA.

The pad area includes, a gate line pad GP provided in plurality including gate line pads GP which are connected to the gate signal lines GLS, a data line pad DLP which is provided in plurality including data line pads DLP which are connected to the data signal lines DLS, a power supply pad VDP which is connected to the power supply line VDS, and second sensor pads TP2 which are connected to the sensing lines RL. The gate line pads GP may be extensions of the gate signal lines GLS and may include a same material as the gate signal lines GLS, the data line pads DLP may be extensions of the data signal lines DLS and may include a same material as the data signal lines DLS, the power supply pad VDP may be an extension of the power supply line VDS and may include a same material as the power supply line VDS, and the second sensor pads TP2 may be extensions of the sensing lines RL and may include a same material as the sensing lines RL. As including a same material, elements may be in a same layer as each other such as to be respective patterns of a same material layer.

In a plan view, the pad area may include a length along a first direction (e.g., X-axis direction in FIG. 4). The length of pad area may extend along an edge of the display panel 100. The gate signal lines GLS, the gate line pads GP, the data signal lines DLS, the data line pads DLP, the power supply line VDS, the power supply pad VDP, the sensing lines RL and the second sensor pads TP2 may each have a width along a length direction of the pad area and/or the edge of the display panel 100. The width of gate line pads GP may be greater than the width of gate signal lines GLS, the width of the data line pads DLP may be greater than the width of the data signal lines DLS, the width of the power supply pad VDP may be greater than the width of the power supply line VDS, and the width of the second sensor pads TP2 may be greater than the width of the sensing lines RL. However, the embodiment is not limited to this. Alternatively, the widths of the gate line pads GP, the data line pads DLP, the power supply pad VDP and the second sensor pads TP2 may be the same as, or smaller than, the widths of the gate signal lines GLS, the data signal lines DLS, the power supply line VDS and the sensing lines RL, respectively.

The gate line pads GP, the data line pads DLP, the power supply pad VDP and the second sensor pads TP2 on the first surface of the substrate SUB may be electrically connected to the circuit board 300 which is disposed below the substrate SUB (e.g., on the second surface of the substrate SUB), via the substrate SUB.

Referring to FIGS. 8 and 9, a TFT ST, a light-emitting element 170, and the sensor electrode layer SENL may be disposed in the display area DA of the substrate SUB. A portion of the gate signal line GLS and a gate line pad GP may be disposed in the non-display area NDA of the substrate SUB.

The substrate SUB may include a base layer such as a polymer resin PSM and first conductive balls CM, which are scattered in the polymer resin PSM, to provide conductivity within the substrate SUB. The first conductive balls CM1 may be randomly scattered in the polymer resin PSM.

The polymer resin PSM may include polyimide ("PI"), polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polycarbonate ("PC"), cellulose triacetate ("CAT"), cellulose acetate propionate ("CAP") or a combination thereof.

Each of the first conductive balls CM1 may include a core and a conductive film that surrounds the core. The cores of the first conductive balls CM1 may be elastic. Thus, the cores of the first conductive balls CM1 may maintain contact with, and thus be electrically connected to, second conductive balls CM2 of the conductive adhesive member CAM. The conductive films of the first conductive balls CM1 may include or be formed of a conductive material such as gold (Au), nickel (Ni), or a double layer of Au and Ni.

In the non-display area NDA of the substrate SUB, the first buffer layer BF1, the second buffer layer BF2 and the gate insulating layer 130 may be sequentially stacked. The gate signal line GLS and the gate line pad GP may be disposed on the gate insulating layer 130. A first pad hole PH1 may be extended through the first buffer layer BF1, the second buffer layer BF2 and the gate insulating layer 130 to expose the first surface of the substrate SUB. The gate line pad GP may be electrically connected to the substrate SUB via the first pad hole PH1. That is, the gate line pad GP may fill the first pad hole PH1 to be in contact with the top surface of the substrate SUB at the first pad hole PH1.

The conductive adhesive member CAM may be disposed at a location of the substrate SUB which corresponds to the non-display area NDA. The conductive adhesive member CAM may not overlap with the display area DA. The conductive adhesive member CAM may electrically connect the substrate SUB and the circuit board 300 to each other.

The conductive adhesive member CAM may include a base layer such as an adhesive resin ADR and a second conductive ball CM2 (e.g., second conductive member) provided in plural including the second conductive balls CM2, which are scattered in the adhesive resin ADR. The adhesive resin ADR may include or be formed of a thermosetting resin such as an epoxy resin. The second conductive balls CM2 may include the same structure as the first conductive balls CM1 described above.

The circuit board 300 to which the display driving circuit 200 is attached, may be disposed below the conductive adhesive member CAM. That is, the display driving circuit 200 may face the conductive adhesive member CAM with the circuit board 300 therebetween. The circuit board 300 may include a first bump electrode BPE1 on a first surface of the circuit board 300. The first bump electrode BPE1 may be disposed on the first surface of the circuit board 300 that faces the substrate SUB, and the display driving circuit 200 may be disposed on a second surface of the circuit board 300 which is opposite to the first surface thereof.

In the non-display area NDA, the conductive adhesive member CAM may overlap the gate signal line GLS and the gate line pad GP. The conductive adhesive member CAM may overlap with or correspond to each of the circuit board 300 and the first bump electrode BPE1, along the thickness direction of the display panel 100.

The gate line pad GP, the first conductive balls CM1, the second conductive balls CM2, and the first bump electrode BPE1 may be in electrical contact with each other, such as by thermal compression. That is, the gate line pad GP may be in contact with the first conductive balls CM1 of the substrate SUB, the first conductive balls CM1 may be in contact with the second conductive balls CM2 of the conductive adhesive member CAM, and the second conductive balls CM2 may be in contact with the first bump electrode BPE1 of the circuit board 300. That is, in the non-display area NDA, the circuit board 300 is electrically connected to the signal line by contact of the circuit board 300 with the conductive adhesive member CAM, together with contact of the conductive material in the substrate SUB with both the signal line and the conductive adhesive member CAM.

In an embodiment, during thermal compression, the first conductive balls CM1 of the substrate SUB and the second conductive balls CM2 of the conductive adhesive member CAM may be compressed in a region of the circuit board 300 that overlaps with or corresponds to the first bump electrode BPE1 of the circuit board 300, along the thickness direction of the display panel 100. As a result, the gate line pad GP may be electrically connected to the circuit board 300 via the substrate SUB.

An entirety of the substrate SUB may include locations which are conductive, such as by a conductive material within the base layer, e.g., the first conductive balls CM1. The first conductive balls CM1 of the substrate SUB may be thermally compressed only at locations of the substrate SUB which are aligned with a location of the first bump electrode BPE1 of the circuit board 300, and may thus be electrically connected to the second conductive balls CM2 at a location corresponding to the first bump electrode BPE1. Accordingly, even if the entirety of the substrate SUB includes locations which are conductive by the first conductive balls CM1, the entirety of the substrate SUB may not necessarily exhibit conductivity, but may be functionally conductive only in the region of the circuit board 300 at the first bump electrode BPE1 thereof.

The data line pads DLP may be electrically connected to the circuit board 300 via the substrate SUB together with the conductive adhesive member CAM.

Referring to FIG. 10, a data signal line DLS and a data line pad DLP may be disposed in the non-display area NDA of the substrate SUB.

In the non-display area NDA of the substrate SUB, the first buffer layer BF1, the second buffer layer BF2, the gate insulating layer 130, the first interlayer insulating layer 141, the second interlayer insulating layer 142 and the first organic layer 150 may be sequentially stacked. The data signal line DLS and the data line pad DLP may be disposed on the second interlayer insulating layer 142. A second pad hole PH2 may be extended through the first buffer layer BF1, the second buffer layer BF2, the gate insulating layer 130, the first interlayer insulating layer 141 and the second interlayer insulating layer 142 to expose the top surface of the substrate SUB. The data line pad DLP may be electrically connected to the substrate SUB through the second pad hole PH2. That is, the data line pad DLP may fill the second pad hole PH2 and may be in contact with the top surface of the substrate SUB.

The conductive adhesive member CAM may be disposed at a location of the substrate SUB which corresponds to the non-display area NDA. The conductive adhesive member CAM may electrically connect the substrate SUB and the circuit board 300 to each other. The circuit board 300 to which the display driving circuit 200 is attached, may be disposed below the conductive adhesive member CAM. The circuit board 300 may further include a second bump electrode BPE2 on a first surface of the circuit board 300. The second bump electrode BPE2 may be disposed on the first surface of the circuit board 300 that faces the substrate SUB, and the display driving circuit 200 may be disposed on a second surface of the circuit board 300 which is opposite to the first surface thereof.

In the non-display area NDA, the conductive adhesive member CAM may overlap with the data signal line DLS and the data line pad DLP. The conductive adhesive member CAM may overlap with or correspond to each of the circuit board 300 and the second bump electrode BPE2, along the thickness of the display panel 100.

The data line pad DLP, the first conductive balls CM1, the second conductive balls CM2 and the second bump electrode BPE2 may be in electrical contact with each other, such as by thermal compression. That is, the data line pad DLP may be in contact with the first conductive balls CM1 of the substrate SUB, the first conductive balls CM1 may be in contact with the second conductive balls CM2 of the conductive adhesive member CAM, and the second conductive balls CM2 may be in contact with the second bump electrode BPE2 of the circuit board 300.

In an embodiment, during thermal compression, the first conductive balls CM1 of the substrate SUB and the second conductive balls CM2 of the conductive adhesive member CAM may be compressed in a region of the circuit board 300 that overlaps with or corresponds to the second bump electrode BPE2 of the circuit board 300, along the thickness direction of the display panel 100. As a result, the data line pad DLP may be electrically connected to the circuit board 300 via the substrate SUB.

As already mentioned above, an entirety of the substrate SUB may include locations which are conductive such as by a conductive material, e.g., the first conductive balls CM1, but a conductive function is provided only in the region of the circuit board 300 at the second bump electrode BPE2 which includes the first conductive balls CM1 which are thermally compressed. Accordingly, even if the entirety of the substrate SUB includes locations which are conductive by the first conductive balls CM1, the entirety of the substrate SUB may not necessarily exhibit conductivity, but may be functionally conductive only in the region of the circuit board 300 at the second bump electrode BPE2 thereof the circuit board 300. In an embodiment, the substrate SUB may be functionally conductive only in regions of the circuit board 300 at the first bump electrode BPE1 and the second bump electrode BPE2 thereof.

Each of the substrate SUB, the substrate SUB, the conductive adhesive member CAM, and the circuit board 300 may include an outer side surface. Outer side surfaces of the substrate SUB, the substrate SUB, the conductive adhesive member CAM, and the circuit board 300 may be disposed at a same side of the display device 10 to correspond to each other.

In an embodiment, the circuit board 300 which is below the substrate SUB and the conductive lines which are above the substrate SUB which are connected to each other via the substrate SUB, may dispose outer side surfaces of the substrate SUB, the conductive adhesive member CAM and the circuit board 300 aligned and in contact, with one another. That is, at a same side of the display device 10, the outer side surface of the substrate SUB may be aligned and in contact with the outer side surface of the conductive adhesive member CAM, and the outer side surface of the conductive adhesive member CAM may be aligned and in contact with the outer side surface of the circuit board 300. However, the embodiment is not limited to this. Alternatively, the outer side surface of the conductive adhesive member CAM may be located inside of the outer side surface of the substrate SUB, and/or the outer side surface of the circuit board 300 may be located inside of the outer side surface of the substrate SUB. As being inside, an element may be spaced apart from other element and be closer to the display area DA than the other element.

Accordingly, since the pad area and the circuit board 300 which are disposed at opposing surfaces of the substrate SUB, are connected to each other within a planar area of the substrate SUB, a planar such as a bending area where the circuit board 300 is bent from the first surface to the second surface along the outer side surface of the substrate SUB is obviated. As a result, the bezel size of the display device 10 can be reduced.

The cross-sectional structures of the power supply pad VDP and the second sensor pads TP2 are not illustrated in FIG. 10, but descriptions thereof will be omitted because they are substantially the same as the cross-sectional structure of the data line pad DLP of FIG. 10.

Figure 11:
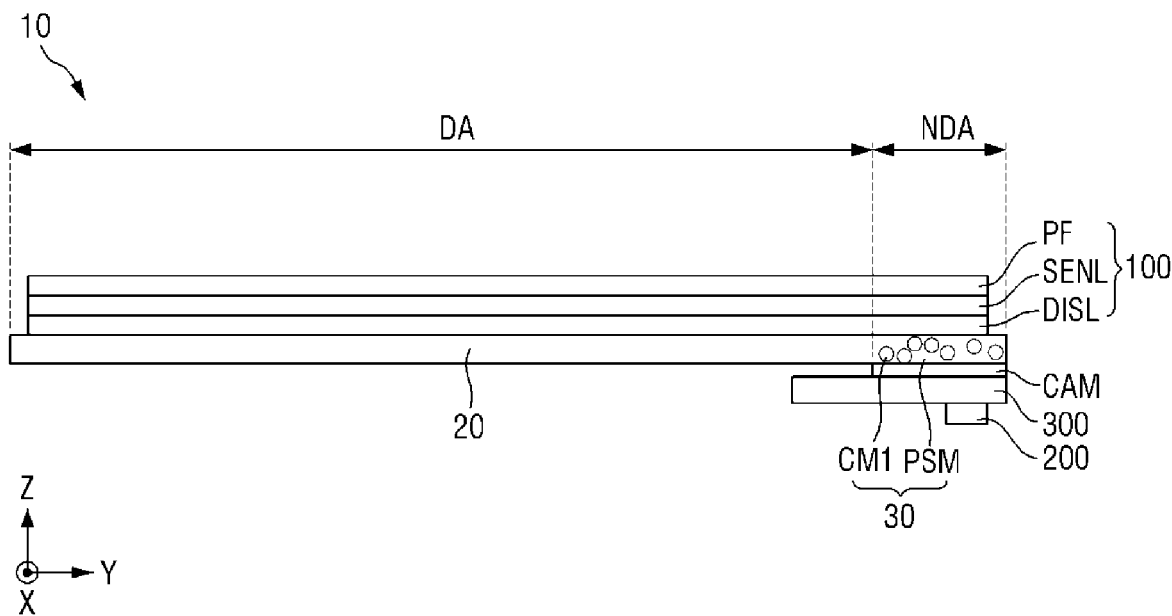
FIG. 11 is a cross-sectional view of an embodiment of a display device.
Figure 12:
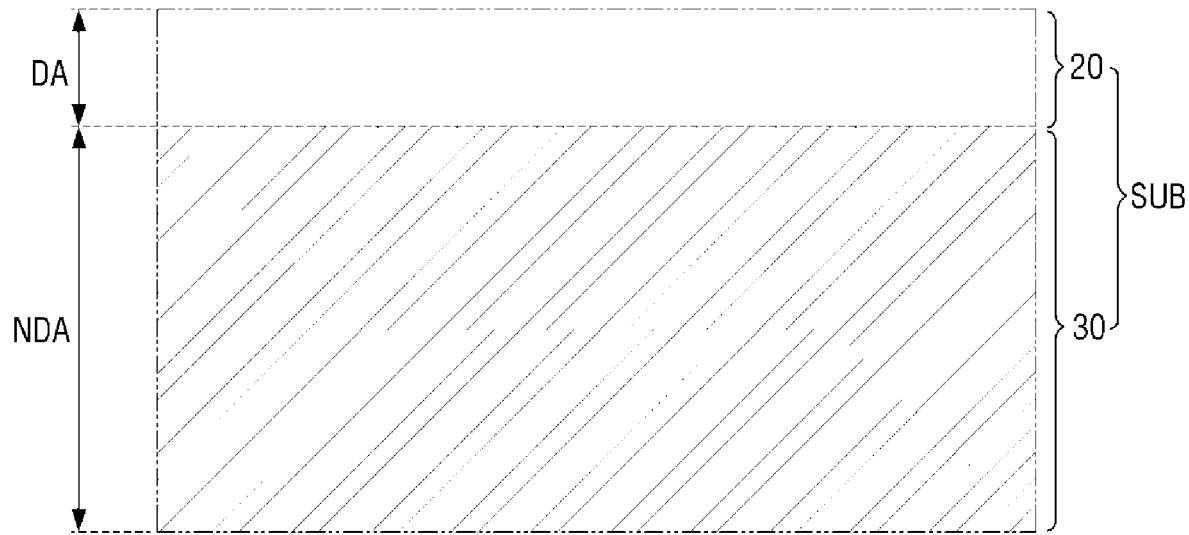
FIG. 12 is a plan view of an embodiment of a substrate of the display device of FIG. 11.
Figure 13:
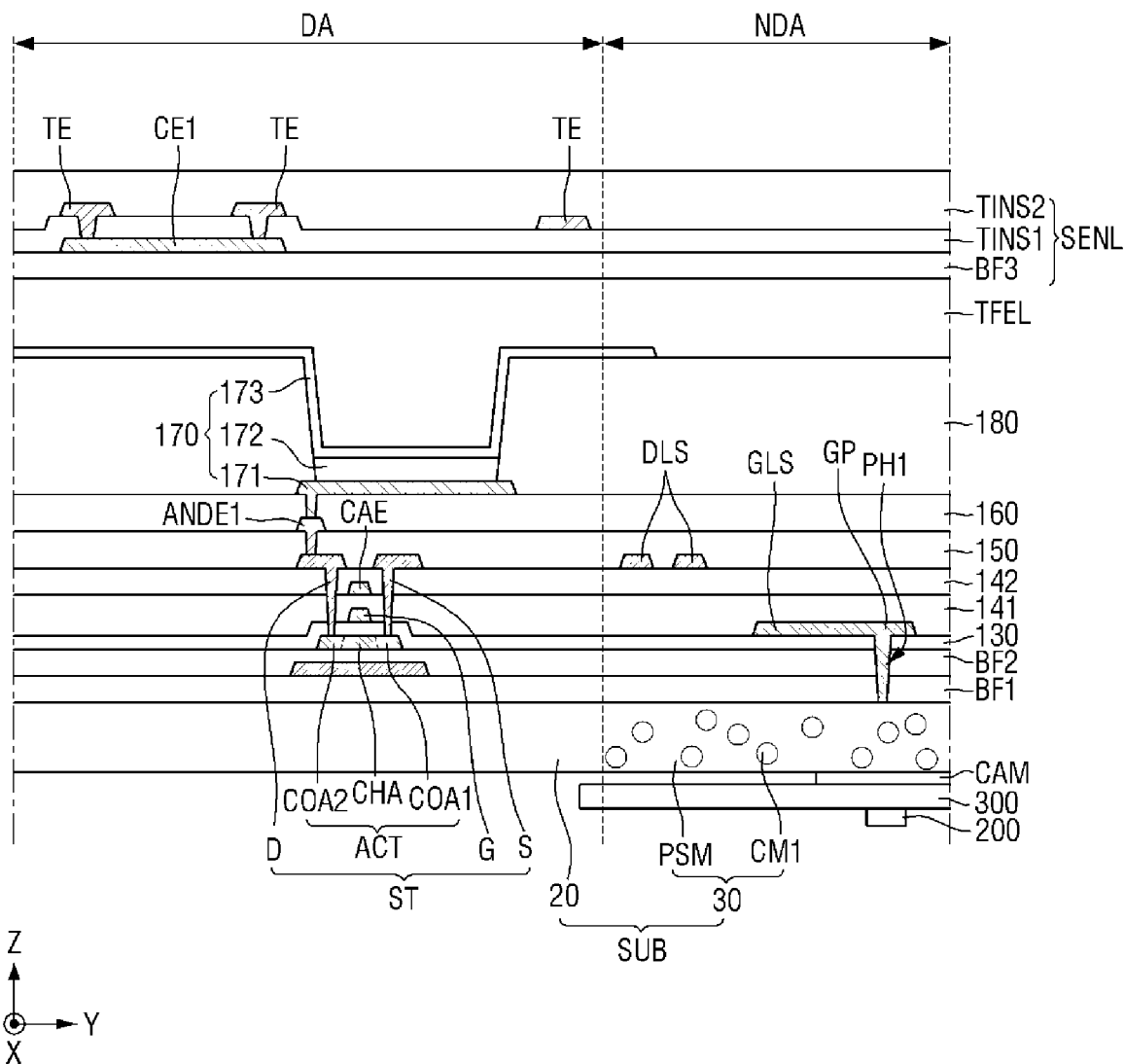
FIG. 13 is a cross-sectional view of an embodiment of the display device of FIG. 11.
Figure 14:
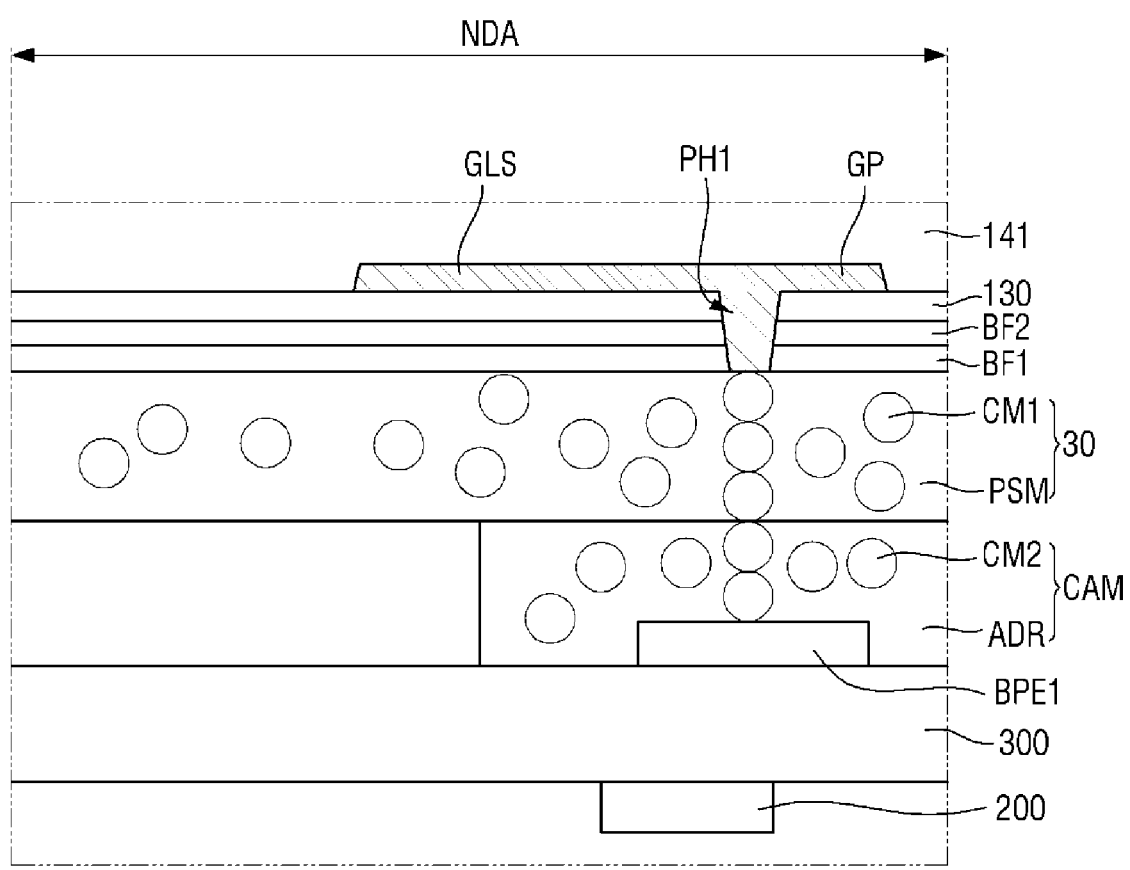
FIG. 14 is an enlarged cross-sectional view of an embodiment of a portion of the display device of FIG. 13.

FIG. 11 is a cross-sectional view of an embodiment of a display device 10. FIG. 12 is a plan view of an embodiment of a substrate SUB of the display device 10 of FIG. 11. FIG. 13 is a cross-sectional view of an embodiment of the display device 10 of FIG. 11. FIG. 14 is an enlarged cross-sectional view of a portion of the display device 10 of FIG. 13.

Referring to FIGS. 11 through 14, a display device 10 may include a substrate SUB that includes a conductive material which provides conductive functionality at thermally compressed locations. The display device 10 of FIGS. 11 through 14 is substantially the same as, or similar to, the display device 10 of FIGS. 3 through 10 except that the conductive material is disposed only in portion of the substrate SUB. Thus, the display device 10 of FIGS. 11 through 14 will hereinafter be described, focusing mainly on the differences with the display device 10 of FIGS. 3 through 10.

Referring to FIGS. 11 and 12, the display device 10 may include a display panel 100, a conductive adhesive member CAM, a display driving circuit 200 and a circuit board 300. The display panel 100 may include the substrate SUB, a display layer DISL, a sensor electrode layer SENL and a polarizing film PF.

The substrate SUB may include a conductive material, e.g., first conductive balls CM1. The substrate SUB may include a first substrate area 20 which includes or is formed of a polymer resin PSM, and a second substrate area 30 which is a remainder of the substrate SUB except for the first substrate area 20. The first and second substrate areas 20 and 30 may be disposed in a same plane, such as a plane defined by a first direction and a second direction. An edge of the first substrate area 20 may be in contact with or meet an edge of the second substrate area 30. The first substrate area 20 may overlap with a light-emitting element 170 of the display layer DISL, and the second substrate area 30 may not overlap with the light-emitting element 170.

The first substrate area 20 may be a planar area that overlaps with or corresponds to a display area DA and excludes the first conductive balls CM1. The first substrate area 20 may be a planar area which includes or is formed only of the polymer resin PSM. The second substrate area 30 may be a planar area that overlaps with or corresponds to the non-display area NDA and includes the polymer resin PSM together with the first conductive balls CM1 which are scattered in the polymer resin PSM. The second substrate area 30 may be disposed at an outer area of the substrate SUB and may be a planar outside of the display area DA. The second substrate area 30 may define the outer side surface of the substrate SUB.

Specifically, referring to FIGS. 13 and 14, a TFT ST, the light-emitting element 170 and the sensor electrode layer SENL may be disposed in the display area DA of the substrate SUB. A gate signal line GLS and a gate line pad GP may be disposed in the non-display area NDA of the substrate SUB.

The first substrate area 20 of the substrate SUB may overlap with the TFT ST, the light-emitting element 170 and the sensor electrode layer SENL. The second substrate area 30 may not overlap with the TFT ST and the light-emitting element 170.

The first substrate area 20 may include only the polymer resin PSM to exhibit non-conductivity, and may not include the first conductive balls CM1. The second substrate area 30 may include both the polymer resin PSM and the first conductive balls CM1 which are a conductive material scattered in the polymer resin PSM, to exhibit conductivity. The first conductive balls CM1 may be randomly scattered in the polymer resin PSM.

A first buffer layer BF1, a second buffer layer BF2 and a gate insulating layer 130 may be sequentially stacked on the second substrate area 30 of the substrate SUB. A gate signal line GLS and a gate line pad GP may be disposed on the gate insulating layer 130. A first pad hole PHI which exposes the substrate SUB to outside the first buffer layer BF1, the second buffer layer BF2 and the gate insulating layer 130, may be provided. The gate line pad GP may be electrically connected to the substrate SUB through the first pad hole PH1. That is, the gate line pad GP may fill the first pad hole PHI to be in contact with the top surface of the substrate SUB at the first pad hole PH1.

A conductive adhesive member CAM may be disposed below the second substrate area 30 of the substrate SUB. The conductive adhesive member CAM may electrically connect the substrate SUB and the circuit board 300 to each other. The second substrate area 30 may overlap with or correspond to the conductive adhesive member CAM and the circuit board 300. In a direction along the substrate SUB, the conductive adhesive member CAM is spaced apart from the first substrate area 20 which excludes the conductive material.

The conductive adhesive member CAM may include an adhesive resin ADR and second conductive balls CM2 which are scattered in the adhesive resin ADR. The circuit board 300 to which the display driving circuit 200 is attached, may be disposed below the conductive adhesive member CAM. A first bump electrode BPE1 of the circuit board 300 may be disposed on a first surface of the circuit board 300, and the display driving circuit 200 may be disposed on a second surface of the circuit board 300 which is opposite to the first surface thereof.

The gate line pad GP, the first conductive balls CM1, the second conductive balls CM2 and the first bump electrode BPE1 may be thermally compressed together and may thus be in electrical contact with one another. That is, the gate line pad GP may be in contact with the first conductive balls CM1 of the substrate SUB, the first conductive balls CM1 may be in contact with the second conductive balls CM2 of the conductive adhesive member CAM, and the second conductive balls CM2 may be in contact with the first bump electrode BPE1 of the circuit board 300. During thermal compression, the first conductive balls CM1 of the substrate SUB and the second conductive balls CM2 of the conductive adhesive member CAM may be compressed in a region of the circuit board 300 that is aligned with the first bump electrode BPE1 of the circuit board 300. As a result, the gate line pad GP may be electrically connected to the circuit board 300 via the substrate SUB.

A portion of the substrate SUB, e.g., the second substrate area 30, may include the first conductive balls CM1. The first conductive balls CM1 may be thermally compressed only in the region of the circuit board 300 that is aligned with the first bump electrode BPE1 of the circuit board 300, and may thus be electrically connected to the second conductive balls CM2 at the region of the circuit board 300. That is, the gate line pad GP of the display panel 100 and the first bump electrode BPE1 of the circuit board 300 may be electrically connected to each other by providing or forming the second substrate area 30 which includes the first conductive balls CM1 in a region that of the substrate SUB which is aligned with a display pad area DPA and provides conductivity. Accordingly, the use of conductive members can be reduced, and as a result, the manufacturing cost of the display device 10 can be reduced.

Figure 15:
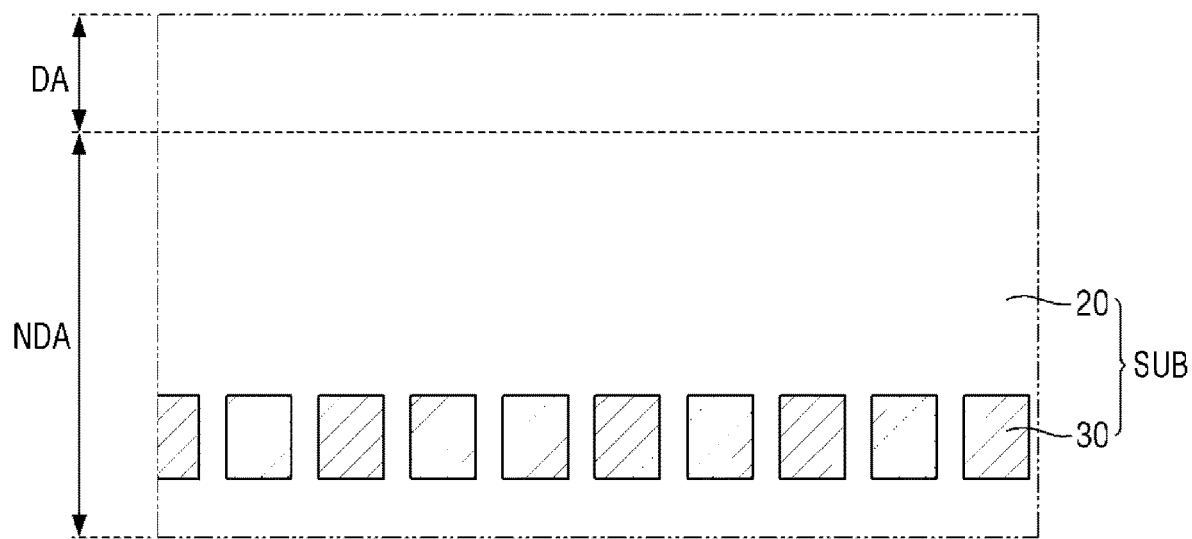
FIG. 15 is a plan view of an embodiment of a substrate of a display device.
Figure 16:
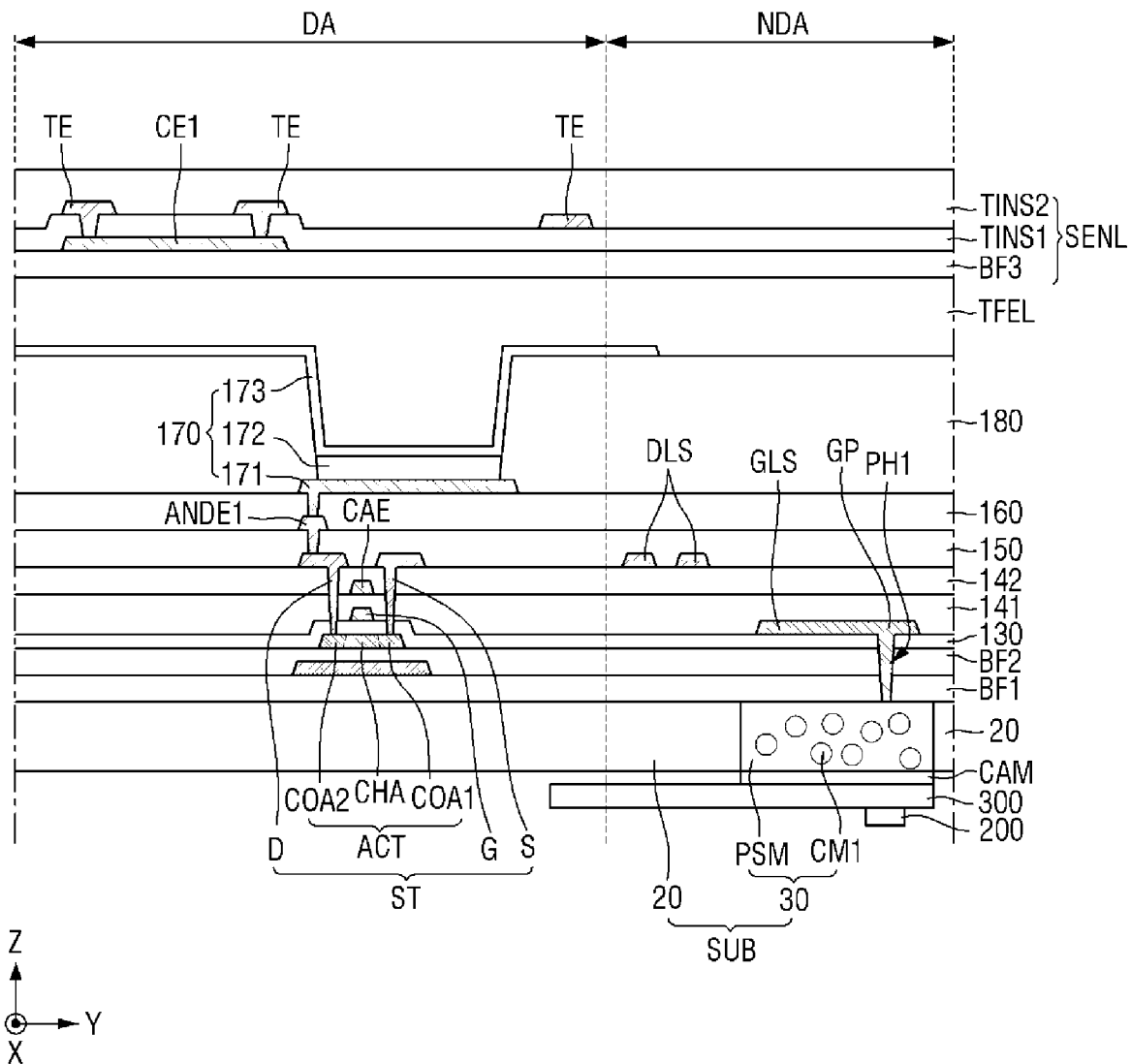
FIG. 16 is a cross-sectional view of an embodiment of the display device of FIG. 15.
Figure 17:
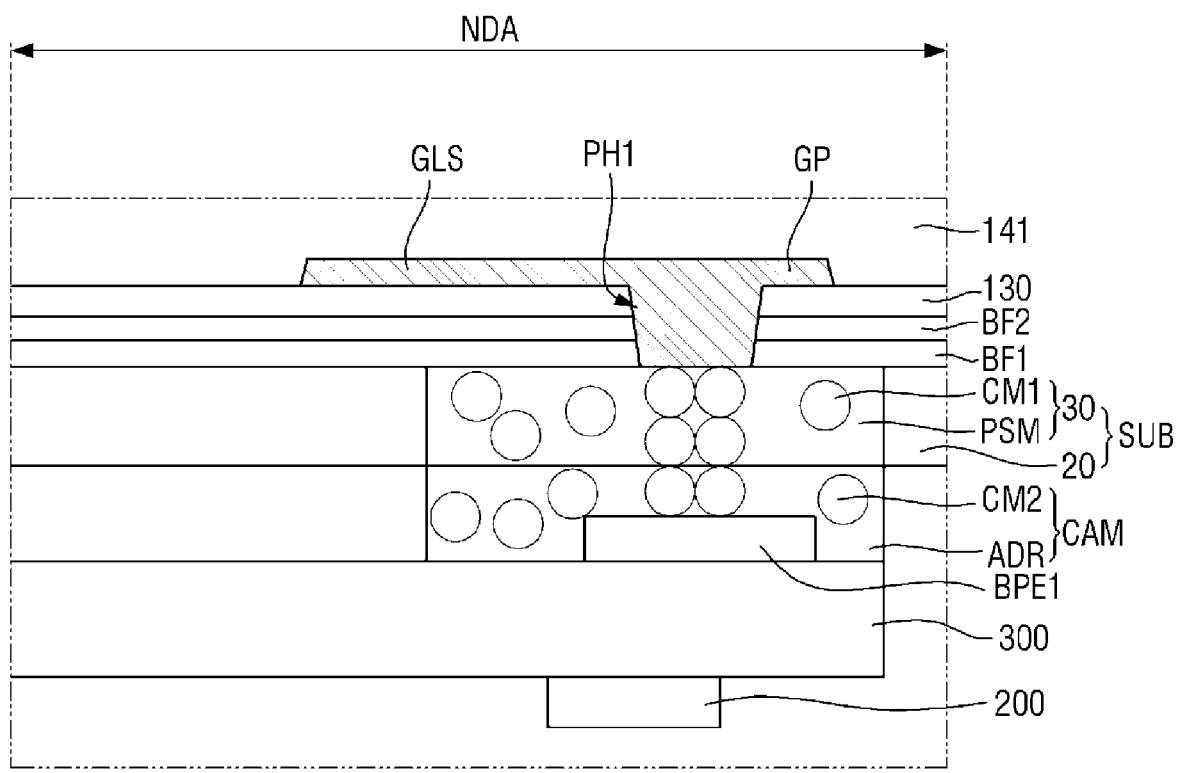
FIG. 17 is a cross-sectional view of an embodiment of portion of the display device of FIG. 15.

FIG. 15 is a plan view of an embodiment of a substrate SUB of a display device 10. FIG. 16 is a cross-sectional view of the display device 10 of FIG. 15. FIG. 17 is a cross-sectional view of an embodiment of a portion of the display device 10 of FIG. 15.

Referring to FIGS. 15 through 17, a display device 10 may include a substrate SUB that includes a conductive material. The display device 10 of FIGS. 15 through 17 differs from the display device 10 of FIGS. 3 through 14 in that the conductive material is disposed in a portion of the substrate SUB as island patterns (e.g., discrete pattern). Thus, the display device 10 of FIGS. 15 through 17 will hereinafter be described, focusing mainly on the differences with the display device 10 of FIGS. 3 through 14.

Referring to FIG. 15, the substrate SUB of the display device 10 may include a conductive material, e.g., first conductive balls CM1. The substrate SUB may include a first substrate area 20 which includes or is formed of a polymer resin PSM, and the second substrate area 30 provided in plural including second substrate areas 30 as a remainder of the substrate SUB except for the first substrate area 20.

The first substrate area 20 may be a planar area that overlaps with a display area DA and does not include the first conductive balls CM1. The first substrate area 20 may be disposed to be spaced apart from the first conductive balls CM1. The first substrate area 20 may be a planar area that is provided or formed only of the polymer resin PSM.

The second substrate areas 30 may be discrete planar areas that do not overlap with the display area DA, but overlap with a non-display area NDA. The discrete planar areas include the polymer resin PSM and the first conductive balls CM1 which are scattered in the polymer resin PSM. The second substrate areas 30 may be arranged in the non-display area NDA as island patterns. The second substrate areas 30 may be disposed to be a predetermined distance apart from one another and may be surrounded by the first substrate area 20.

Specifically, referring to FIGS. 16 and 17, a TFT ST, a light-emitting element 170, and a sensor electrode layer SENL may be disposed in the display area DA of the substrate SUB. A gate signal line GLS and a gate line pad GP may be disposed in the non-display area NDA of the substrate SUB. The cross-sectional structure of an area corresponding to the gate signal line GLS and the gate line pad GP will hereinafter be described. The cross-sectional structure of an area where a data signal line DLS and a data line pad DLP are disposed, is substantially the same as described above with reference to FIG. 10, and thus, a detailed description thereof will be omitted.

The first substrate area 20 of the substrate SUB may overlap with the TFT ST, the light-emitting element 170 and the sensor electrode layer SENL. A second substrate area 30 of the substrate SUB may not overlap with the TFT ST and the light-emitting element 170. In an embodiment, in a direction along the substrate SUB, the light-emitting element 170 is spaced apart from the second substrate area 30 which includes the conductive material.

The first substrate area 20 may include only the polymer resin PSM to exhibit non-conductivity and may not include the first conductive balls CM1. The second substrate area 30 may include both the polymer resin PSM and the first conductive balls CM1 which are a conductive material scattered in the polymer resin PSM, to exhibit conductivity. The first conductive balls CM1 may be randomly scattered in the polymer resin PSM.

A first buffer layer BF1, a second buffer layer BF2 and a gate insulating layer 130 may be sequentially stacked on the second substrate area 30 of the substrate SUB. The gate signal line GLS and the gate line pad GP may be disposed on the gate insulating layer 130. A first pad hole PH1 which exposes the substrate SUB to outside the first buffer layer BF1, the second buffer layer BF2 and the gate insulating layer 130, may be provided. The gate line pad GP may be electrically connected to the substrate SUB through the first pad hole PH1. That is, the gate line pad GP may fill the first pad hole PH1 to be in contact with the top surface of the substrate SUB at the first pad hole PH1.

A conductive adhesive member CAM may be disposed below the second substrate area 30 of the substrate SUB. The conductive adhesive member CAM may electrically connect the substrate SUB and a circuit board 300 to each other. The second substrate area 30 may overlap with the conductive adhesive member CAM and the circuit board 300.

The conductive adhesive member CAM may include an adhesive resin ADR and second conductive balls CM2 which are scattered in the adhesive resin ADR. The circuit board 300 to which a display driving circuit 200 is attached, may be disposed below the conductive adhesive member CAM. A first bump electrode BPE1 of the circuit board 300 may be disposed on a first surface of the circuit board 300, and the display driving circuit 200 may be disposed on a second surface of the circuit board 300 which is opposite to the first surface thereof.

The gate line pad GP, the first conductive balls CM1, the second conductive balls CM2 and the first bump electrode BPE1 may be thermally compressed and may thus be in electrical contact with one another. That is, the gate line pad GP may be in contact with the first conductive balls CM1 of the substrate SUB, the first conductive balls CM1 may be in contact with the second conductive balls CM2 of the conductive adhesive member CAM, and the second conductive balls CM2 may be in contact with the first bump electrode BPE1 of the circuit board 300. During thermal compression, the first conductive balls CM1 of the substrate SUB and the second conductive balls CM2 of the conductive adhesive member CAM may be compressed in a region of the circuit board 300 that is aligned with the first bump electrode BPE1 of the circuit board 300. As a result, the gate line pad GP of the display panel 100 may be electrically connected to the circuit board 300 at the first bump electrode BPE1 thereof, via the substrate SUB.

A portion of the substrate SUB, e.g., the second substrate area 30, may include the first conductive balls CM1. The first conductive balls CM1 may be thermally compressed only in the region of the circuit board 300 that is aligned with the first bump electrode BPE1 of the circuit board 300 and may thus be electrically connected to the second conductive balls CM2. That is, the gate line pad GP and the first bump electrode BPE1 of the circuit board 300 may be electrically connected to each other by forming the second substrate area 30 which includes the first conductive balls CM1, in a region that overlaps with a pad area and provides conductivity. Accordingly, the use of conductive members can be reduced, and as a result, the manufacturing cost of the display device 10 can be reduced.

The substrate SUB may be provided by a solution process.

Figure 18:
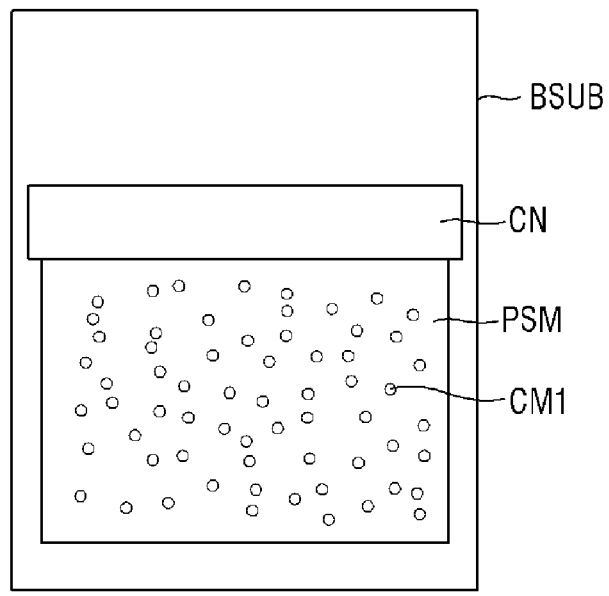
FIGS. 18 through 20 are plan views illustrating structures in an embodiment of a method of providing a substrate of a display device.
Figure 19:
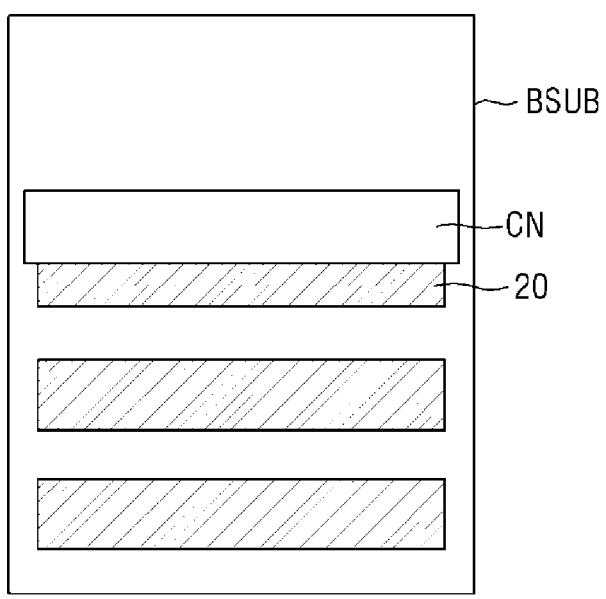
Figure 20:
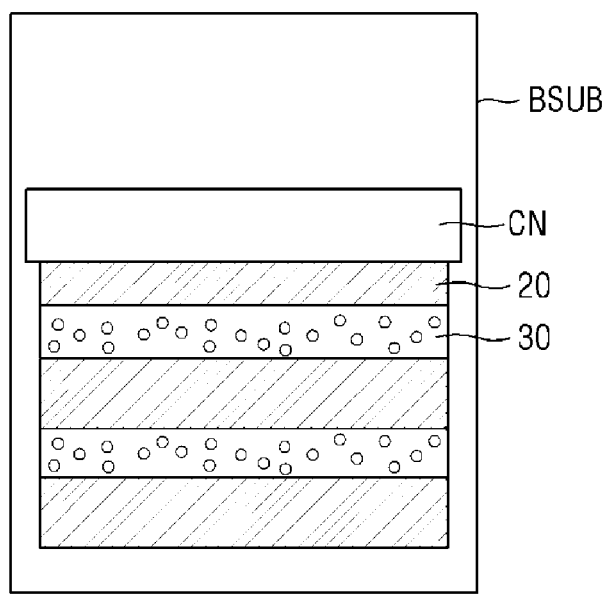

FIGS. 18 through 20 are plan views illustrating embodiments of methods of providing a substrate SUB.

Referring to FIG. 18, a method of providing or fabricating a substrate SUB may include performing a solution process on a base substrate BSUB. Specifically, the base substrate BSUB is provided or prepared. The base substrate BSUB may be a rigid substrate such as a glass substrate or a plastic substrate.

A solution into which a polymer resin PSM and a plurality of first conductive balls CM1 are combined, is provided. The first conductive balls CM1 may be in the polymer resin PSM in the amount of about 0.1 parts by weight to about 10 parts by weight, per 100 parts by weight of the solution. In an embodiment, for example, the solution may include 95 parts by weight of a polyimide resin and 5 parts by weight of nickel conductive balls, among 100 parts by weight. However, the content of the first conductive balls CM1 is not particularly limited.

The solution may be applied on the base substrate BSUB using a solution process. The solution process may be performed using slit coating, nozzle coating, printing or spin coating. The polymer resin PSM having the first conductive balls CM1 combined therein may be applied on the base substrate BSUB and cured, such as by a nozzle coating apparatus CN, thereby obtaining the substrate SUB of FIG. 3. That is, the substrate SUB may include a base substrate BSUB having the polymer resin PSM and the first conductive balls CM1 which are in the polymer resin PSM.

FIGS. 19 and 20 illustrate an embodiment of a method of providing a substrate SUB.

Referring to FIG. 19, a polymer resin PSM excluding first conductive balls CM1 is applied on a base substrate BSUB. First substrate area 20 are provided or formed by applying the polymer resin PSM excluding the first conductive balls CM1 on portions of the base substrate BSUB to form patterns of the polymer resin PSM, and curing the patterns of the polymer PSM excluding the first conductive balls CM1, such as with the use of a nozzle coating apparatus CN.

Referring to FIG. 20, a second substrate area 30 is provided in plural including second substrate area 30 provided or formed by applying a polymer resin PSM having first conductive balls CM1 therein in planar areas other than planar areas of the first substrate areas 20 and curing the polymer resin having the first conductive balls CM1 combined therein with the use of the nozzle coating apparatus CN. In this manner, the substrate SUB of FIG. 15 can be obtained. The substrate SUB of FIG. 12 can also be obtained by using the method of FIGS. 19 and 20.

Alternatively, a substrate SUB including first and second substrate areas 20 and 30 can be provided using a photolithography method. In an embodiment, for example, a polymer resin PSM may be applied on an entirety of a base substrate BSUB, and a patterned first substrate area may be provided or formed by photolithography. Thereafter, a polymer resin PSM including conductive members may be applied on the entirety of the base substrate BSUB and may then be patterned only in a planar area other than the first substrate area 20, thereby forming a second substrate area 30.

As already mentioned above, since a circuit board 300 which is electrically connected to a pad area at a front surface of a substrate SUB including a conductive material, is attached to the substrate SUB at the rear surface thereof, a planar area of the display device 10 at which the circuit board 300 and/or the substrate SUB is bent can be omitted. Accordingly, the bezel size of a display device 10 can be reduced.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:
1. A display device comprising:
   a substrate including:
      a display area,
      a non-display area which is adjacent to the display area,
      a top surface and a bottom surface which is opposite to the top surface, and
      a conductive material;
   in the display area, a display layer including a light-emitting element, the display layer on the top surface of the substrate;

a signal line connected to the light-emitting element, the signal line extending from the display layer and into the non-display area; and in the non-display area:
a conductive adhesive member on the bottom surface of the substrate; and
a circuit board facing the signal line with both the substrate and the conductive adhesive member therebetween, wherein in the non-display area, the circuit board is electrically connected to the signal line by contact of the circuit board with the conductive adhesive member, together with contact of the conductive material in the substrate with both the signal line and the conductive adhesive member.

2. The display device of claim 1, wherein the substrate further includes:
a polymer resin, and
the conductive material including a plurality of first conductive balls which are within the polymer resin,
wherein in the non-display area, the circuit board is electrically connected to the signal line by contact of the plurality of first conductive balls in the substrate, with both the signal line and the conductive adhesive member.

3. The display device of claim 2, wherein the conductive adhesive member includes:
an adhesive resin, and
a plurality of second conductive balls which are within the adhesive resin,
wherein in the non-display area, the circuit board is electrically connected to the signal line by contact of the circuit board with the plurality of second conductive balls in the conductive adhesive member, together with contact of the plurality of first conductive balls in the substrate with both the signal line and the plurality of second conductive balls in the conductive adhesive member.

4. The display device of claim 3, wherein
the substrate further includes a thickness direction defined between the top surface and the bottom surface of the substrate, and
the conductive adhesive member is aligned with the non-display area of the substrate and the signal line, along the thickness direction of the substrate.

5. The display device of claim 4, wherein
the signal line which extends from the display layer and into the non-display area defines a conductive pad in the non-display area, and
in the non-display area:
the display layer defines a pad hole which exposes the top surface of the substrate,
at the pad hole, the conductive pad extends through the display layer to contact the top surface of the substrate which is exposed at the pad hole, and
the circuit board is electrically connected to the signal line by contact of the plurality of first conductive balls in the substrate with the conductive pad of the signal line which contacts the top surface of the substrate at the pad hole.

6. The display device of claim 5, wherein in the non-display area, the conductive pad, the first conductive balls of the substrate and the second conductive balls of the conductive adhesive member are aligned with and in respective contact, with each other along the thickness direction of the substrate.

7. The display device of claim 6, wherein
the circuit board includes a bump electrode, and
in the non-display area:
the bump electrode of the circuit board is aligned with the first conductive balls of the substrate and the second conductive balls of the conductive adhesive member, along the thickness direction of the substrate, and
the circuit board is electrically connected to the signal line by contact of the bump electrode of the circuit board with the plurality of second conductive balls in the conductive adhesive member.

8. The display device of claim 1, wherein
each of the substrate, the conductive adhesive member and the circuit board includes an outer side surface which is furthest from the display area, and
the outer side surface of the substrate, the outer side surface of the conductive adhesive member and the outer side surface of the circuit board are aligned with one another.

9. The display device of claim 1, wherein the substrate further includes the conductive material scattered along both the display area and the non-display area of the substrate.

10. A display device comprising
a substrate including:
a display area,
a non-display area which is adjacent to the display area,
a top surface and a bottom surface which is opposite to the top surface,
is a conductive material,
a first substrate area excluding the conductive material, the first substrate area corresponding to the display area, and
a second substrate area including the conductive material, the second substrate area corresponding to the non-display area;
in the display area, a display layer including a light-emitting element, the display layer on the top surface of the substrate;
a signal line connected to the light-emitting element, the signal line extending from the display layer and into the non-display area; and
in the non-display area:
a conductive adhesive member on the bottom surface of the substrate; and
a circuit board facing the signal line with both the second substrate area and the conductive adhesive member therebetween,
wherein in the non-display area, the circuit board is electrically connected to the signal line by contact of the circuit board with the conductive adhesive member, together with contact of the conductive material in the second substrate area with both the signal line and the conductive adhesive member.

11. The display device of claim 10, wherein
the first substrate area and the second substrate area are disposed in a same plane as each other,
each of the first substrate area and the second substrate area has an edge, and
the edge of the first substrate area meets the edge of the second substrate area.

12. The display device of claim 10, wherein
the substrate further includes an outer side surface which is furthest from the display area, and
in the non-display area, the second substrate area defines the outer edge of the substrate and corresponds to the conductive adhesive member.

13. The display device of claim 12, wherein
in a direction along the substrate, the conductive adhesive member is spaced apart from the first substrate area which excludes the conductive material,
the substrate further includes a thickness direction defined between the top surface and the bottom surface of the substrate, and
in the non-display area, the circuit board is electrically connected to the signal line by contact along thickness direction of the substrate, of the conductive material in the second substrate area with the conductive adhesive member.

14. The display device of claim 10, wherein
the light-emitting element corresponds to the first substrate area which excludes the conductive material, and
in a direction along the substrate, the light-emitting element is spaced apart from the second substrate area which includes the conductive material.

15. The display device of claim 10, wherein
the first substrate area further corresponds to a portion of the non-display area, and
in the non-display area:
  the second substrate area is provided in plural including a plurality of second substrate areas spaced apart from one another, and
  each of the plurality of second substrate areas is surrounded by the first substrate area.

16. The display device of claim 10, wherein
the substrate further includes:
  a polymer resin, and
the conductive material including a plurality of first conductive balls which are within the polymer resin, and
in the non-display area, the circuit board is electrically connected to the signal line by contact of the plurality of first conductive balls in the second substrate area with both the signal line and the conductive adhesive member.

17. The display device of claim 16, wherein
the conductive adhesive member includes:
  an adhesive resin, and
  a plurality of second conductive balls which are within the adhesive resin, and
in the non-display area, the circuit board is electrically connected to the signal line by contact of the circuit board with the plurality of second conductive balls in the conductive adhesive member, together with contact of the plurality of first conductive balls in the second substrate area with both the signal line and the plurality of second conductive balls in the conductive adhesive member.

18. The display device of claim 17, wherein
the circuit board includes a bump electrode,
the signal line which extends from the display layer and into the non-display area defines a conductive pad in the non-display area,
the substrate further includes a thickness direction defined between the top surface and the bottom surface of the substrate,
the bump electrode of the circuit board, the first conductive balls of the second substrate area and the second conductive balls of the conductive adhesive member are aligned with each other along the thickness direction of the substrate, and
in the non-display area, the circuit board is electrically connected to the signal line by contact of the bump electrode of the circuit board with the plurality of second conductive balls in the conductive adhesive member.

19. The display device of claim 18, wherein the conductive pad, the first conductive balls of the second substrate area, the second conductive balls of the conductive adhesive member and the bump electrode of the circuit board are aligned with and in respective contact with each other, along the thickness direction of the substrate.

20. The display device of claim 10, wherein
each of the second substrate area, the conductive adhesive member and the circuit board includes an outer side surface with is furthest from the display area, and
the outer side surface of the second substrate area, the outer side surface of the conductive adhesive member and the outer side surface of the circuit board are aligned with one another.

* * * * *